(12) United States Patent
Huang

(10) Patent No.: US 11,018,169 B2
(45) Date of Patent: May 25, 2021

(54) METAL-INSULATOR-METAL CAPACITOR STRUCTURE TO INCREASE CAPACITANCE DENSITY

(71) Applicant: Taiwan Semiconductor Manufacturing Co., Ltd., Hsin-Chu (TW)

(72) Inventor: Yimin Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/543,859

(22) Filed: Aug. 19, 2019

(65) Prior Publication Data

US 2021/0057469 A1 Feb. 25, 2021

(51) Int. Cl.
*H01L 27/146* (2006.01)
*H01L 49/02* (2006.01)

(52) U.S. Cl.
CPC .. *H01L 27/14603* (2013.01); *H01L 27/14636* (2013.01); *H01L 27/14643* (2013.01); *H01L 27/14689* (2013.01); *H01L 28/92* (2013.01)

(58) Field of Classification Search
CPC ............... H01L 27/14603; H01L 28/92; H01L 27/14689; H01L 27/14636; H01L 27/14643

See application file for complete search history.

(56) References Cited

U.S. PATENT DOCUMENTS

| 10,418,407 | B2 * | 9/2019 | Na | H01L 27/14681 |
| 2012/0146182 | A1 * | 6/2012 | Oganesian | H01L 28/91 257/532 |
| 2017/0170224 | A1 * | 6/2017 | Huang | H01L 21/8221 |

* cited by examiner

*Primary Examiner* — Syed I Gheyas
(74) *Attorney, Agent, or Firm* — Eschweiler & Potashnik, LLC

(57) ABSTRACT

Various embodiments of the present disclosure are directed towards an integrated circuit (IC) including a capacitor. The capacitor is over a substrate and includes a first electrode having a plurality of first electrode layers that are vertically stacked over one another. The plurality of first electrode layers respectively contact an adjacent first electrode layer in a plurality of first connection regions. A second electrode including a plurality of second electrode layers that are vertically stacked over one another. The plurality of second electrode layers respectively contact an adjacent second electrode layer in a plurality of second connection regions. The plurality of second electrode layers are respectively stacked between adjacent ones of the plurality of first electrode layers. A capacitor dielectric structure separates the plurality of first electrode layers and the plurality of second electrode layers.

20 Claims, 18 Drawing Sheets

METAL-INSULATOR-METAL CAPACITOR STRUCTURE TO INCREASE CAPACITANCE DENSITY

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CISs). Compared to CCD image sensors, CISs are favored due to, among other things, low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
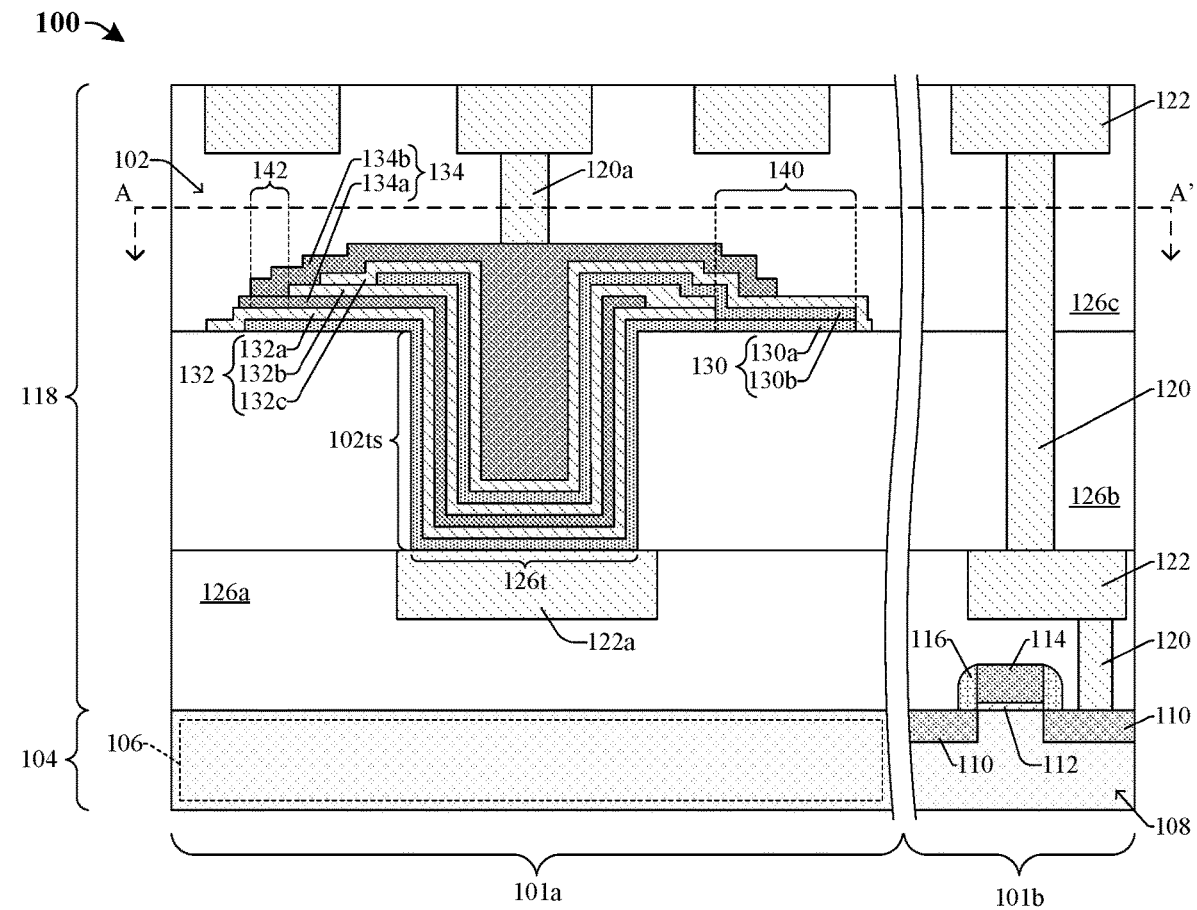
FIG. 1 illustrates a cross-sectional view of some embodiments of an integrated circuit (IC) including a trench capacitor overlying a photodetector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor of the array of pixel sensors includes an array of photodetectors (e.g., a 2×2 photodetector array) disposed in a substrate and a plurality of pixel devices (e.g., transfer transistors, source-follower transistors, reset transistors, row-select transistors, etc.). Trench capacitors may, for example, be embedded in the substrate and may be electrically coupled to the pixel sensors (e.g., to one or more of the pixel devices). In such embodiments, the trench capacitors may be used as decoupling capacitors for the pixel sensor.

In some instances, a trench capacitor overlies a substrate and fills a trench defined by the substrate. Further, the trench capacitor comprises multiple electrodes and one or more dielectric layers, where the multiple electrodes and the dielectric layer(s) are alternatingly stacked in the trench. A conductive via overlies each electrode, where the multiple electrodes may be electrically coupled together by way of the conductive vias and one or more conductive wires. As the number of electrodes increases, a capacitance density of the trench capacitor increases. However, as the number of electrodes increases, the number of conductive vias contacting the trench capacitor increases accordingly. This causes a minimum size of the trench capacitor to increase to accommodate the conductive vias disposed over each electrode (e.g., a minimum width and/or length of the trench capacitor is greater than 2 micrometers), thereby decreasing a space available on the substrate for the photodetectors and/or pixel devices (e.g., transfer transistors, source follower transistors, etc.). Further, incident radiation disposed upon the substrate may interact with (reflect off of and/or absorbed by) the trench capacitor and/or the conductive vias, thereby decreasing a quantum efficiency (QE) of the pixel sensors.

Various embodiments of the present application are directed towards a trench capacitor with a high capacitance density and a small size (e.g., a minimum width and/or a minimum length of less than 0.76 micrometers). In some embodiments, the trench capacitor fills a trench defined by an interconnect dielectric structure that overlies a substrate having a photodetector. The trench capacitor includes a first capacitor electrode, a capacitor dielectric structure, and a second capacitor electrode. The first capacitor electrode includes a lower first electrode layer and an upper second electrode layer that each line the trench and directly contact one another in a first region outside the trench. The second capacitor electrode includes a lower second electrode layer and an upper second electrode layer that each line the trench and directly contact one another at a second region outside the trench. The upper first electrode layer is disposed between the upper and lower second electrode layers, and the lower second electrode layer is disposed between the upper and lower first electrode layers. The first electrode is separated from the second electrode by the capacitor dielectric structure. Further, a conductive via is disposed over the upper second electrode layer and the lower first electrode layer contacts an underlying conductive wire disposed in the interconnect dielectric structure. By virtue of the upper and lower capacitor electrodes each comprising more than one electrode layer, a capacitance density of the trench capacitor is increased. Further, because the electrode layers of the first and second capacitor electrodes respectively directly contact one another, conductive contacts utilized to electrically couple electrode layers together may be omitted. This may reduce a minimum width and/or a minimum length of the trench capacitor (e.g., to less than 0.76 micrometers, respectively), increase a capacitance density of the trench capacitor, and/or increase a number of photodetectors that may be disposed within the substrate.

FIG. 1 illustrates a cross-sectional view of some embodiments of an integrated circuit (IC) 100 having a trench capacitor 102 overlying a substrate 104.

The IC 100 has a pixel region 101a neighboring a logic region 101b. The pixel region 101a includes a photodetector 106 that is disposed within the substrate 104. In some embodiments, the substrate 104 may, for example, be or comprise a bulk silicon substrate and/or may comprise a first doping type (e.g., p-type). The photodetector 106 is configured to convert incident electromagnetic radiation (e.g. light) into an electrical signal. The photodetector 106 comprises a second doping type (e.g., n-type) opposite the first doping type. An interconnect structure 118 overlies the substrate 104 and is configured to electrically couple devices (e.g., transistors, the photodetector 106, the trench capacitor 102, etc.) to one another. The interconnect structure 118 includes a plurality of inter-level dielectric (ILD) layers 126a-126c, a plurality of conductive vias 120, and a plurality of conductive wires 122. The logic region 101b is disposed laterally adjacent to the pixel region 101a. The logic region 101b includes semiconductor device(s), such as a transistor 108. The transistor 108 overlies the substrate 104 and is electrically coupled to the conductive vias 120 and the conductive wires 122 in the interconnect structure 118. The transistor 108 includes source/drain regions 110, a gate dielectric layer 112, a gate electrode 114, and a sidewall spacer structure 116.

The pixel region 101a further includes the trench capacitor 102. The trench capacitor 102 has a trench segment 102ts that fills a trench 126t defined by at least one of the ILD layers 126b. The trench capacitor 102 has a first electrode 130, a second electrode 134, and a capacitor dielectric structure 132. The first electrode 130 includes a lower first electrode layer 130a and an upper first electrode layer 130b. The second electrode 134 includes a lower second electrode layer 134a and an upper second electrode layer 134b. The capacitor dielectric structure 132 includes a plurality of capacitor dielectric layers 132a-c. The lower second electrode layer 134a is spaced between the upper and lower first electrode layers 130a-b by the capacitor dielectric layers 132a-b. The upper first electrode layer 130b is spaced between the upper and lower second electrode layers 134a-b by the capacitor dielectric layers 132b-c.

By virtue of the first and second electrodes 130, 134 respectively having more than one electrode layer, a capacitance density of the trench capacitor 102 may be increased. For example, the capacitance (C) (in farads) of the trench capacitor 102 is defined as:

$$C = \varepsilon_i \varepsilon_0 \frac{A}{d}$$

Where A is the area of overlap between the first and second electrodes 130, 134; $\varepsilon_i$ is the relative static permittivity of the capacitor dielectric structure 132 between the first and second electrodes 130, 134; $\varepsilon_0$ is the electric constant ($\varepsilon_0 \approx 8.854 \times 10^{-12}$ F m$^{-1}$); and d is the distance separating the first and second electrodes 130, 134. Therefore, in some embodiments, by increasing the area (A) of overlap between the first and second electrodes 130, 134, the capacitance (C) of the trench capacitor 102 may be increased (e.g., to greater than 75 femtofarads for a pixel size of approximately 2 um$^2$). In further embodiments, to increase the area (A) of overlap between the first and second electrodes 130, 134, the number of electrode layers that the first and second electrodes 130, 134 each comprise may be increased.

The upper and lower first electrode layers 130a-b contact one another in a first connection region 140, wherein the upper and lower first electrode layers 130a-b are directly electrically coupled together. The upper and lower second electrode layers 134a-b contact one another in a second connection region 142, wherein the upper and lower second electrode layers 134a-b are directly electrically coupled together. The first connection region 140 and the second connection region 142 are each laterally offset from the trench 126t by a non-zero distance.

In some embodiments, because the upper and lower first electrode layers 130a-b directly contact one another, a conductive via and/or wire that would otherwise be used to electrically couple the foregoing layers together may be omitted. Further, because the upper and lower second electrode layers 134a-b directly contact one another, a conductive via and/or wire that would otherwise be used to electrically couple the foregoing layers together may also be omitted. This, in part, decreases a minimum width of the trench capacitor 102 (e.g., the trench capacitor 102 has a minimum width less than 0.76 micrometers) and/or decreases time and costs associated with forming the IC 100. Furthermore, by reducing the number of conductive vias and/or wires 120, 122 in the interconnect structure 118, a quantum efficiency (QE) of the photodetector 106 is increased.

An upper conductive via 120a of the conductive vias 120 is directly electrically coupled to the upper second electrode layer 134b. A lower surface of the lower first electrode layer 130a is directly electrically coupled to a lower conductive wire 122a of the conductive wires 122. In some embodiments, the upper conductive via 120a is the only conductive via directly contacting and/or directly electrically coupled to the trench capacitor 102. In such embodiments, the lower conductive wire 122a is the only conductive wire directly contacting and/or directly electrically coupled to the trench capacitor 102. Because the lower conductive wire 122a and the upper conductive via 120a are the only conductive via and wire directly electrically coupled to the trench capacitor 102, an area of the trench capacitor 102 overlying the photodetector 106 may be reduced. This, in part, facilitates shrinking a surface area of the substrate 104 that the trench capacitor 102 overlies (which increases a number of capacitors that may be disposed over the substrate 104), increases a QE of the photodetector 106, and/or decreases noise in the IC 100.

Figure 2A:
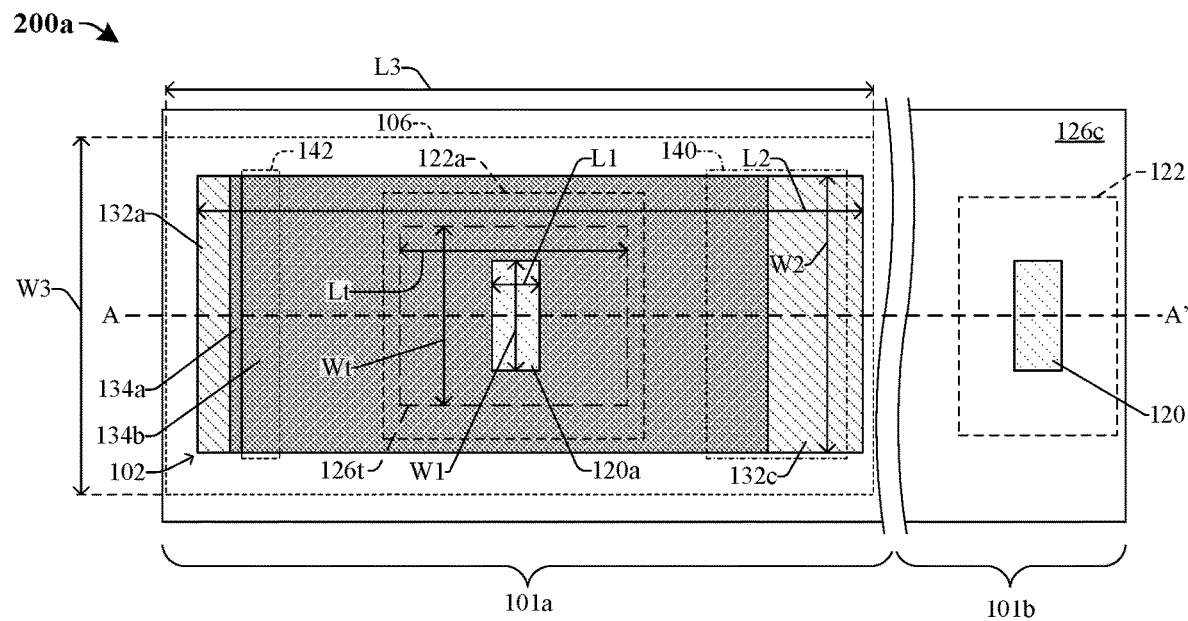
FIG. 2A illustrates a top view of some alternative embodiments of the IC of FIG. 1.

FIG. 2A illustrates a top view 200a of some embodiments of the IC 100 of FIG. 1 taken along line A-A' of FIG. 1. For clarity, a part of the ILD layer 126c directly overlying the trench capacitor 102 is omitted from FIG. 2A.

The upper conductive via 120a has a length L1 and a width W1. In some embodiments, the length L1 and the width W1 may be substantially equal. In other embodiments, the length L1 and the width W1 may be different. For example, in some embodiments, the length L1 may be about 0.36 micrometers or greater and/or the width W1 may be about 0.6 micrometers. In other embodiments, a minimum value for the length L1 and/or the width W1 may be less than 0.36 micrometers. Further, in some embodiments, when viewed from above, the upper conductive via 120a may have a circular shape. In such embodiments, the upper conductive via 120a may have a minimum diameter of about 0.36 micrometers. In some embodiments, the trench 126t has a length Lt and a width Wt. In some embodiments, the width Wt is greater than about 0.24 micrometers, greater than about 0.27 micrometers, or within a range of about 0.1 to 0.3 micrometers. In yet further embodiments, the length Lt is within a range of about 0.1 to 0.3 micrometers.

The trench capacitor 102 has a length L2 and a width W2. In some embodiments, the length L2 and/or the width W2 may each have a minimum value of less than about 0.76 micrometers. In some embodiments, if the minimum value is greater than 0.76 micrometers, then a QE of the photodetector 106 may be decreased and/or a time and costs associated with forming the IC 100 may be increased. In further embodiments, if the minimum value is substantially less than 0.76 micrometers (e.g., approximately 0.36 micrometers or less), then a connection between the upper conductive via 120a and the trench capacitor 102 may be unstable.

In some embodiments, the minimum value of the length L2 and the width W2 of the trench capacitor 102 depends upon the length L1 and the width W1 of the upper conductive via 120a, respectively. For example, in some embodiments, the upper conductive via 120a may be the only conductive via that directly contacts the trench capacitor 102. In such embodiments, the minimum value of the length L2 and the width W2 of the trench capacitor 102 should each be sufficiently large enough (e.g., approximately 0.36 or greater) such that the upper conductive via 120a may be disposed on the trench capacitor 102. This in turn facilities forming a good electrical connection (e.g., an ohmic contact) between the trench capacitor 102 and the upper conductive via 120a. Thus, the length L2 and the width W2 of the trench capacitor 102 depends upon the length L1 and the width W1 of the upper conductive via 120a.

The photodetector 106 has a length L3 and a width W3. In some embodiments, the length L3 and/or the width W3 may each be less than about 2 micrometers. The length L3 and the width W3 of the photodetector 106 may be greater than the length L2 and the width W2 of the trench capacitor 102. For example, the length L2 and/or the width W2 of the trench capacitor 102 may be at least half of the length L3 and/or the width W3 of the photodetector 106, respectively. This may increase a QE of the photodetector 106 and/or increase a number of trench capacitors 102 that may be disposed over the substrate 104.

In some embodiments, the length L3 and the width W3 of the photodetector 106 depends upon the length L2 and the width W2 of the trench capacitor 102, respectively. For example, incident radiation disposed upon the substrate (104 of FIG. 1) may interact with (reflect off of and/or absorbed by) the trench capacitor 102, thereby lowering a QE of the photodetector 106. In such embodiments, as the length L2 and the width W2 of the trench capacitor 102 increases the length L3 and the width W3 of the photodetector 106 increases, thereby mitigating the reduction of the QE of the photodetector 106 due to the interaction of the incident radiation with the trench capacitor 102. Thus, in some embodiments, because the upper conductive via 120a is the only conductive via that directly contacts the trench capacitor 102, the length L2 and the width W2 of the trench capacitor 102 are each substantially small (e.g., less than about 0.76 micrometers each). This in turn facilities the length L3 and the width W3 of the photodetector 106 each being less than 2 micrometers, thereby increasing a number of photodetectors 106 that may be disposed within the substrate (104 of FIG. 1) while maintaining and/or increasing the QE of the photodetector 106.

In some embodiments, a ratio of an area of the trench capacitor 102 to an area of the upper conductive via 120a, when viewed from above, is about 2:1, about 3:1, about 4:1, or about 5:1. For example, in some embodiments, the area of the trench capacitor 102 is two times greater than, three times greater than, four times greater than, or five times greater than the area of the upper conductive via 120a. Further, a ratio of an area of the photodetector to the area of the trench capacitor 102, when viewed from above, is about 2:1, about 3:1, about 4:1, or about 5:1. For example, the area of the photodetector may be about two times greater than the area of the trench capacitor 102.

Figure 2B:
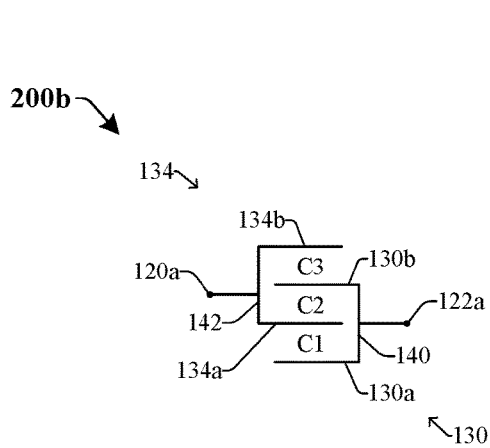
FIG. 2B illustrates some embodiments of a schematic according to some alternative embodiments of the IC of FIG. 1.

FIG. 2B illustrates a schematic 200b according to some alternative embodiments of the trench capacitor 102 of FIG. 1.

As illustrated in FIG. 2B, the first electrode 130 has a lower first electrode layer 130a and an upper first electrode layer 130b each configured as a capacitor plate. The lower and upper first electrode layers 130a-b are directly electrically coupled to one another at the first connection region 140 (illustrated as a wire in FIG. 2B). The second electrode 134 has a lower second electrode layer 134a and an upper second electrode layer 134b each configured as a capacitor plate. The lower and upper second electrode layers 134a-b are directly electrically coupled to one another at the second connection region 142 (illustrated as a wire in FIG. 2B). A first capacitive element with a first capacitance (C1) is established between the lower first electrode layer 130a and the lower second electrode layer 134a, a second capacitive element with a second capacitance (C2) is established between the lower second electrode layer 134a and the upper first electrode layer 130b, and a third capacitive element with a third capacitance (C3) is established between the upper first electrode layer 130b and the upper second electrode layer 134b. The first, second, and third capacitive elements are arranged electrically in parallel, wherein a total capacitance (Ctot) of the trench capacitor 102, as measured between the upper conductive via 120a and the lower conductive wire 122a, is a sum of the capacitance of each capacitive element (e.g., Ctot=C1+C2+C3).

Figure 3B:
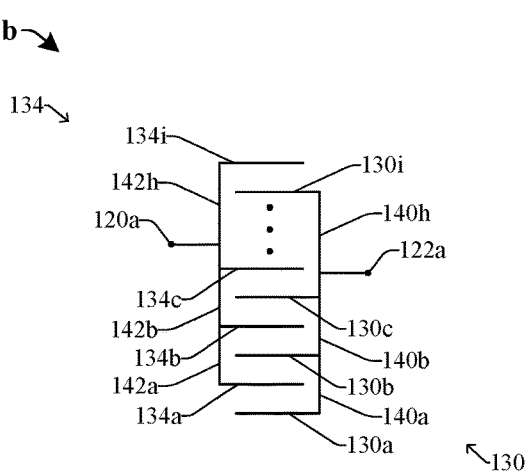
FIG. 3B illustrates some embodiments of a schematic according to some alternative embodiments of the IC of FIG. 3A.
Figure 3A:
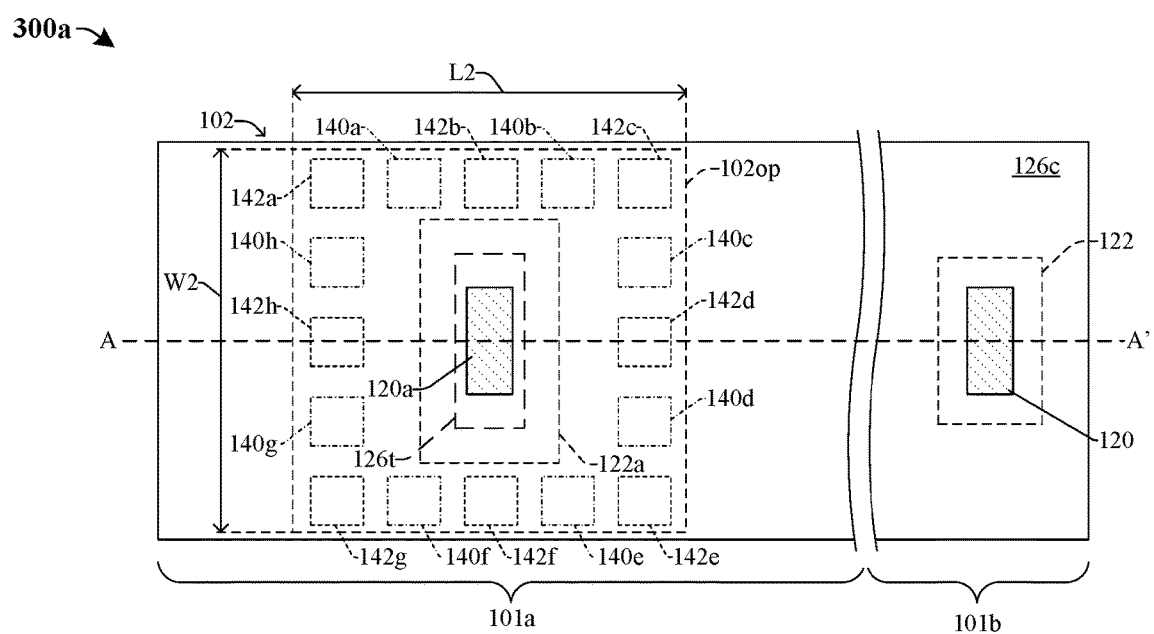
FIG. 3A illustrates a top view of some embodiments of an IC having a trench capacitor.

FIG. 3A illustrates a top view of an IC 300a corresponding to some alternative embodiments of the IC 100 of FIG. 1 taken along line A-A' of FIG. 1.

A first plurality of connection regions 140a-h and a second plurality of connection regions 142a-h each surround the trench 126t. In some embodiments, the first plurality of connection regions 140a-h corresponds to regions in which first electrode layers of the first electrode (130 of FIG. 1) directly contact an adjacent first electrode layer (e.g., a region in which lower first electrode layer 130a contacts upper first electrode layer 130b). In such embodiments, if the trench capacitor 102 has N (N is a whole number greater than 1) connection regions in the first plurality of connection regions 140a-h, then the first electrode (130 of FIG. 1) has at least N+1 first electrode layers (not shown).

Further, the second plurality of connection regions 142a-h corresponds to regions in which second electrode layers of the second electrode (134 of FIG. 1) directly contact an adjacent second electrode layer. In such embodiments, if the trench capacitor 102 has M (M is a whole number greater than 1) connection regions in the second plurality of connection regions 142a-g, then the second electrode (134 of FIG. 1) has at least M+1 second electrode layers (not shown). A second electrode layer of the second electrode (134 of FIG. 1) is disposed between each adjacent pair of first electrode layers in the first electrode (130 of FIG. 1), and a first electrode layer of the first electrode (130 of FIG. 1) is disposed between each adjacent pair of second electrode layers in the second electrode (134 of FIG. 1). The first electrode (130 of FIG. 1) is electrically coupled to the lower conductive wire 122a and the second electrode (134 of FIG. 1) is electrically coupled to the upper conductive via 120a. The first electrode layers of the first electrode (130 of FIG. 1) are separated from the second electrode layers of the second electrode (134 of FIG. 1) by the capacitor dielectric structure (132 of FIG. 1). Thus, a capacitive element is established between each first electrode layer and each adjacent second electrode layer. Each connection region, first electrode layer, and/or second electrode layer added to the trench capacitor 102 increases a capacitance of the trench capacitor 102. In such embodiments, the length L2 and/or the width W2 of the trench capacitor 102 remain constant and/or less than about 0.76 micrometers, respectively. Therefore, the capacitance of the trench capacitor 102 may be increased while maintaining a surface area of the substrate (104 of FIG. 1) that the trench capacitor 102 overlies. This, in part, may increase a number of capacitors that may be disposed over the substrate (104 of FIG. 1) and/or increase a QE of the photodetector (106 of FIG. 1).

FIG. 3B illustrates a schematic 300b according to some alternative embodiments of the trench capacitor 102 of FIG. 3A.

The first electrode 130 has a plurality of first electrode layers 130a-i (first electrode layers 130d-h are omitted from FIG. 3B for ease of illustration) each configured as a capacitor plate. Each first electrode layer in the plurality of first electrode layers 130a-i is directly electrically coupled to and/or directly contacts an adjacent first electrode layer by way of the first plurality of connection regions 140a-h (connection regions 140c-g are omitted from FIG. 3B for ease of illustration). The first plurality of connection regions 140a-h are illustrated as wires in FIG. 3B. The second electrode 134 has a plurality of second electrode layers 134a-i (second electrode layers 134d-h are omitted from FIG. 3B for ease of illustration) each configured as a capacitor plate. Each second electrode layer in the plurality of second electrode layers 134a-i is directly electrically coupled to and/or directly contacts an adjacent second electrode layer by way of the second plurality of connection regions 142a-h (connection regions 142c-g are omitted from FIG. 3B for ease of illustration). The second plurality of connection regions 142a-h are illustrated as wires in FIG. 3B. A plurality of capacitive elements with corresponding capacitances is established between the plurality of first electrode layers 130a-i and an adjacent second electrode layer from the plurality of second electrode layers 134a-i. The plurality of capacitive elements are arranged electrically in parallel, wherein a total capacitance (Ctot) of the trench capacitor 102, as measured between the upper conductive via 120a and the lower conductive wire 122a, is a sum of the capacitance of each capacitive element.

Figure 4A:
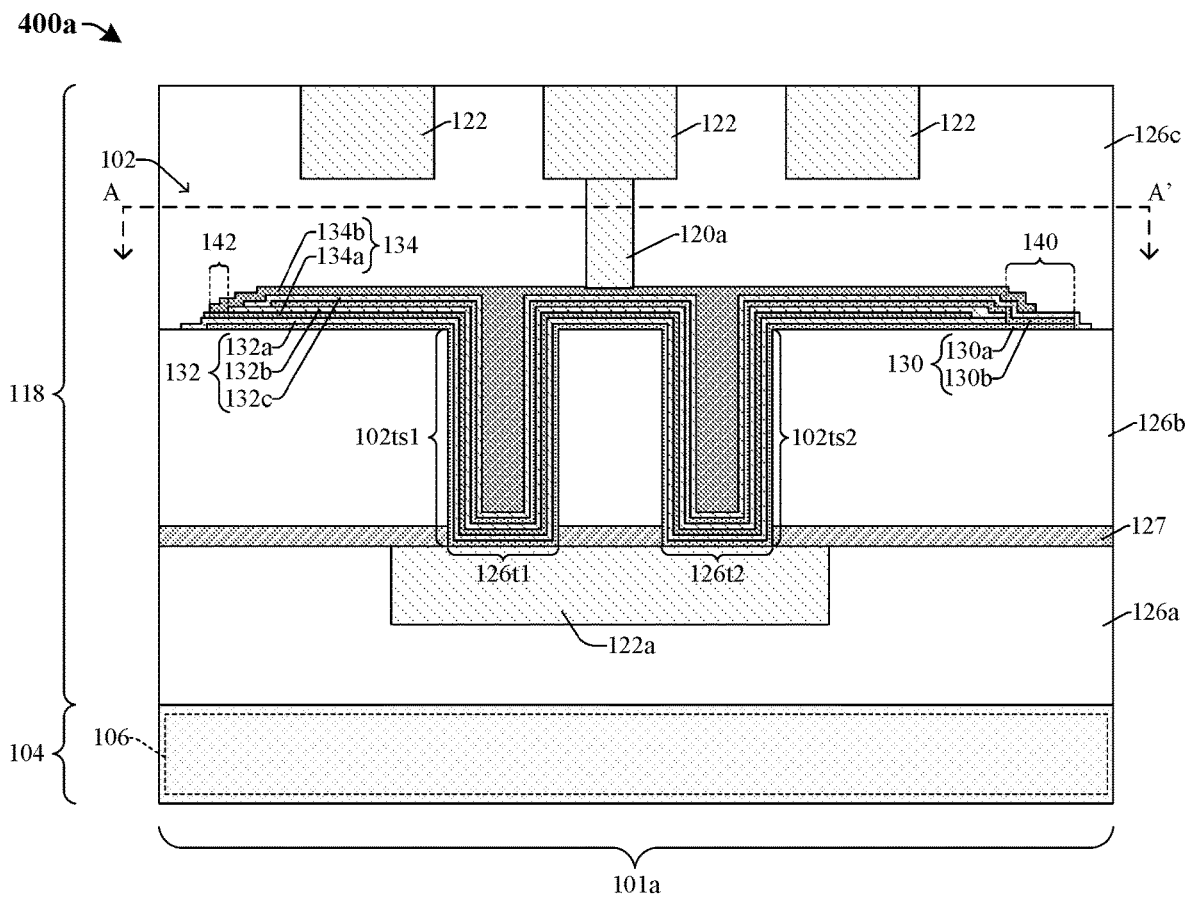
FIG. 4A illustrates a cross-sectional view of some embodiments of an IC including a trench capacitor disposed in more than one trench and overlying a photodetector.

FIG. 4A illustrates a cross-sectional view of an IC 400a according to some alternative embodiments of the IC 100 of FIG. 1.

The plurality of inter-level dielectric (ILD) layers 126a-c overlie the substrate 104. ILD layers 126a-c may, for example, be or comprise an oxide (e.g., silicon dioxide), a low κ dielectric material, a combination of the foregoing, or the like. In some embodiments, the ILD layers 126a-126b may be separated by a dielectric protection layer 127 (e.g., an etch stop layer) and/or may, for example, be or comprise silicon nitride, silicon carbide, or the like. The trench capacitor 102 may have multiple trench segments 102ts1, 102ts2 that respectively fill multiple trenches 126t1, 126t2 defined by at least one of the ILD layers 126a-d. For example, the multiple trenches 126t1, 126t2 are defined by the ILD layer 126b and the dielectric protection layer 127 and directly overlie the lower conductive wire 122a. By disposing the trench capacitor 102 in the multiple trenches 126t1, 126t2, a capacitance density of the trench capacitor 102 may be increased. This is because a surface area between adjacent electrode layers in the first and second electrodes 130, 134 is increased. In such embodiments, the length and/or width (L2, W2 of FIG. 2A) of the trench capacitor 102 may remain constant and/or less than about 0.76 micrometers, respectively (as illustrated and described in FIG. 2A). The length and/or width (L2, W2 of FIG. 2A) may remain constant and/or less than about 0.76 micrometers because, in some embodiments, the upper conductive via 120a may be the only conductive via directly contacting the trench capacitor 102. Thus, a capacitance density of the trench capacitor 102 may be increased while a surface area of the substrate 104 that the trench capacitor 102 overlies remains constant or is reduced, thereby increasing a QE of the photodetector 106 and/or decreasing noise in the IC 100. Further, this facilitates the length and width (L3, W3 of FIG. 2A) of the photodetector 106 each being less than 2 micrometers, such that a number of photodetectors 106 disposed within the substrate 104 may be increased while increasing the capacitance density of the trench capacitor 102.

Figure 4B:
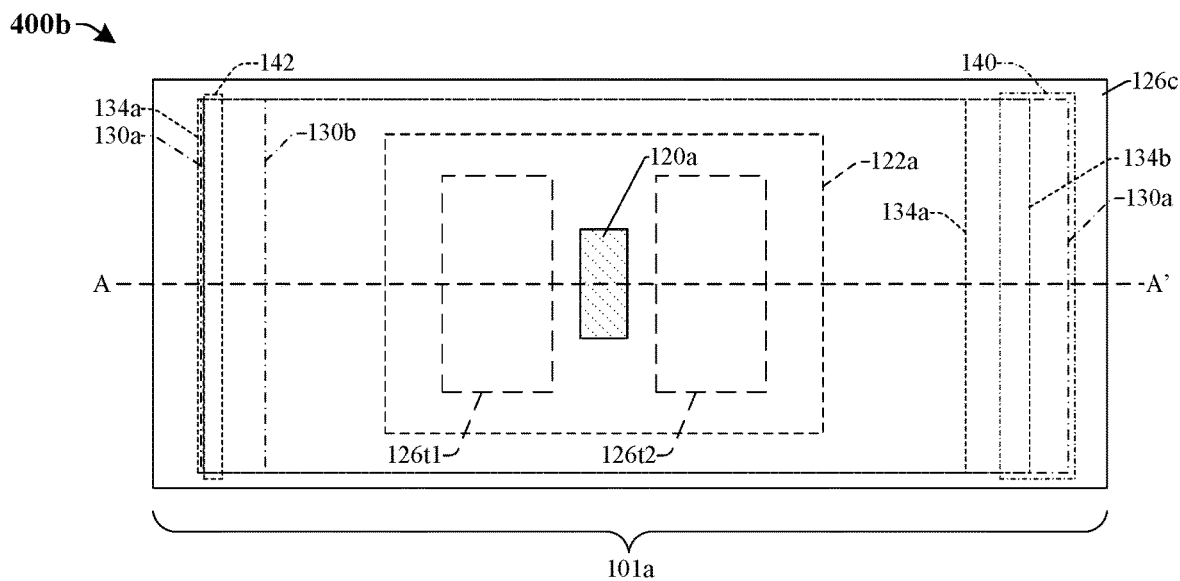
FIGS. 4B-C illustrate top views of some alternative embodiments of the IC of FIG. 4A.

FIG. 4B illustrates a top view 400b of some alternative embodiments of the IC 400a of FIG. 4A taken along line A-A' of FIG. 4A.

The multiple trenches 126t1, 126t2 are laterally offset from the upper conductive via 120a by a non-zero distance. Further, the multiple trenches 126t1, 126t2 are spaced laterally between outer sidewalls of the lower conductive wire 122a.

Figure 4C:
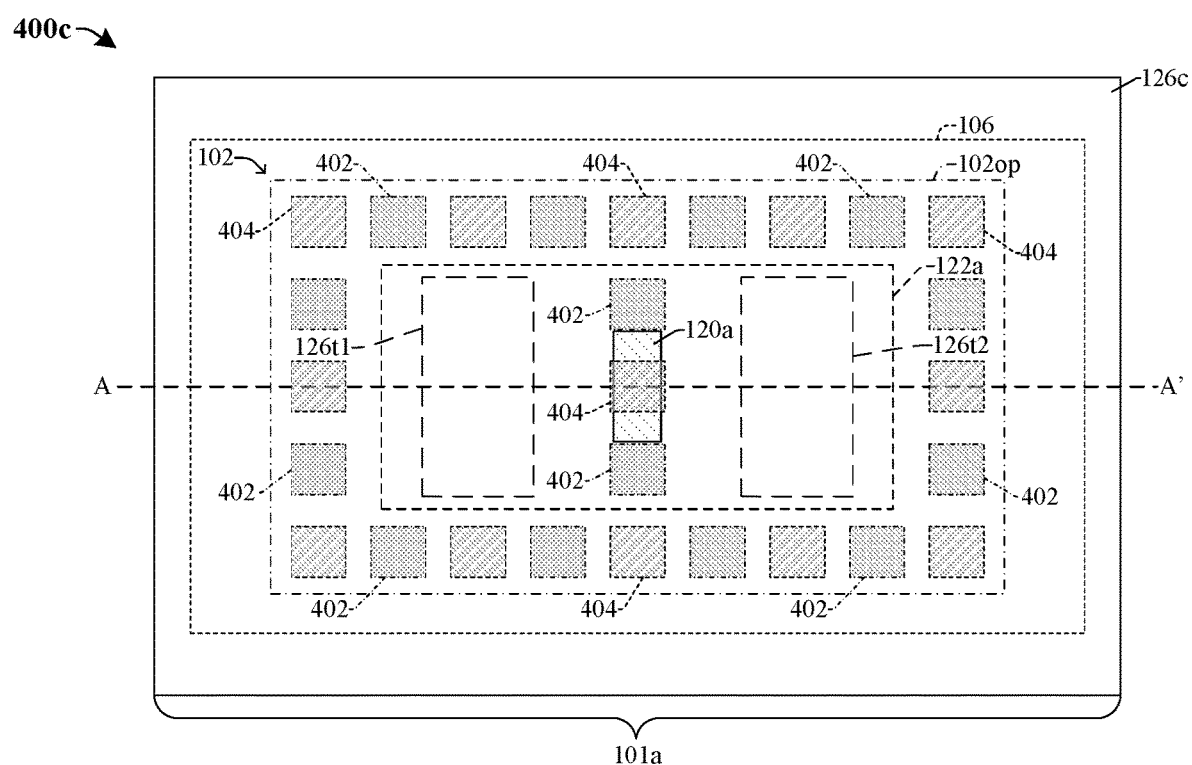

FIG. 4C illustrates a top view 400c of some alternative embodiments of the IC 400a of FIG. 4A taken along line A-A' of FIG. 4A. The top view 400c of FIG. 4C corresponds to a trench capacitor 102 having a plurality of first and second electrode layers.

The trench capacitor 102 has a first plurality of connection regions 402 and a second plurality of connection regions 404. In some embodiments, the first plurality of connection regions 402 are configured as the first plurality of connection regions 140a-h of FIG. 3A, and the second plurality of connection regions 404 are configured as the second plurality of connection regions 142a-h of FIG. 3A. In some embodiments, at least one connection regions of the first and/or second plurality of connection regions 402, 404 directly underlie the upper conductive via 120a. Further, the first and second plurality of connection regions 402, 404 are spaced laterally between an outer perimeter 102op of the trench capacitor 102. Each connection region in the first and second plurality of connection regions 402, 404 is laterally offset from the multiple trenches 126t1, 126t2. Furthermore, the outer perimeter 102op of the trench capacitor 102 is laterally spaced between outer sides of the photodetector 106. Thus, the capacitance density of the trench capacitor 102 may be further increased while a length and width of the trench capacitor 102 is less than a length and width of the photodetector 106. This may increase a QE of the photodetector 106 and/or increase a number of photodetectors that may be disposed on the substrate (104 of FIG. 4A).

Figure 5A:
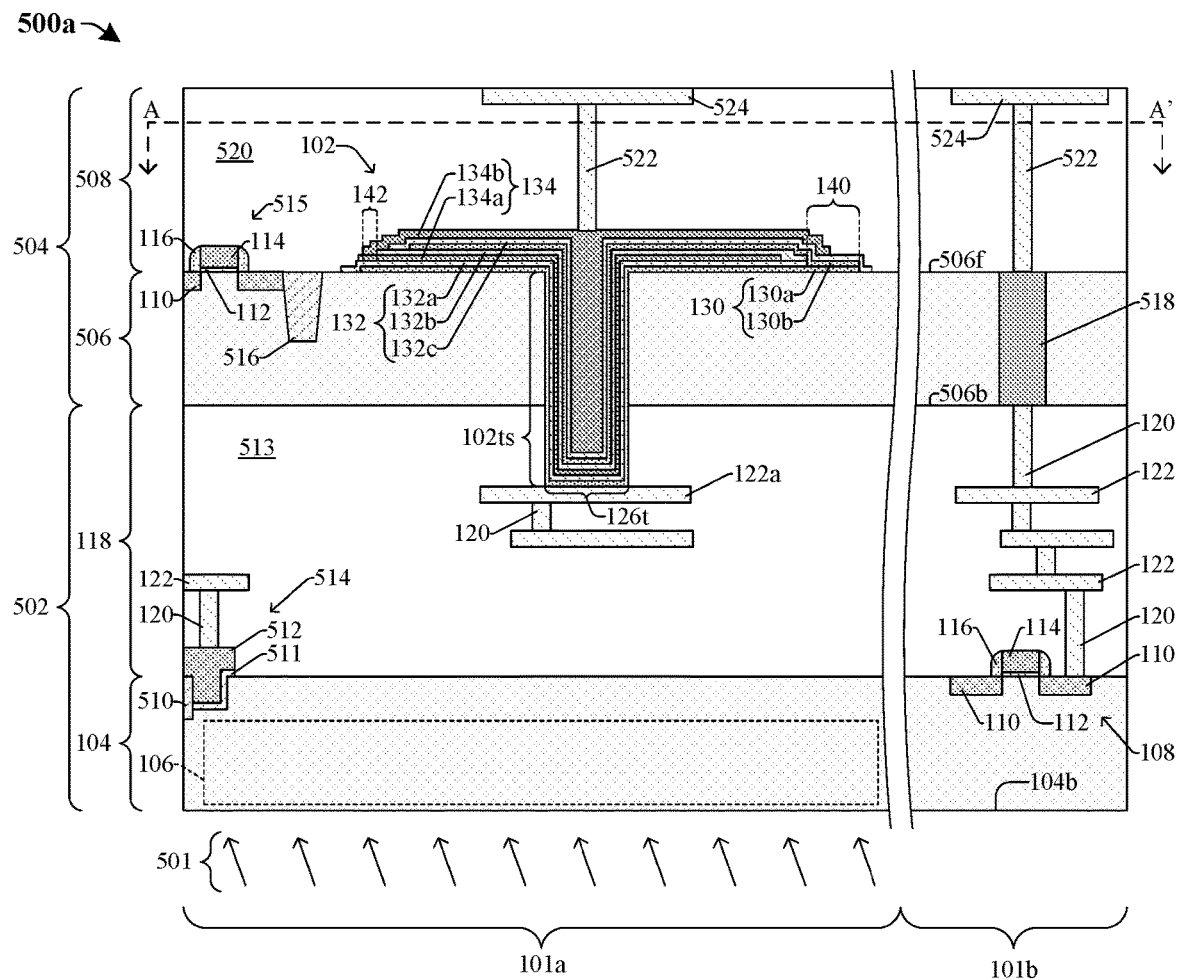
FIG. 5A illustrates a cross-sectional view of some embodiments of a three-dimensional (3D) IC including a first IC die overlying a second IC die, where a trench capacitor extends from the second IC die to the first IC die.

FIG. 5A illustrates a cross-sectional view of some embodiments of a three-dimensional (3D) IC 500a including a first IC die 502 overlying a second IC die 504.

The first IC die 502 includes a first substrate 104 and a first interconnect structure 118. Electromagnetic radiation 501 may be disposed upon a back-side 104b of the first substrate 104, such that the 3D IC 500a may be configured as a back-side illumination (BSI) device. The first interconnect structure 118 includes a first interconnect dielectric structure 513, a first plurality of conductive vias 120, and a first plurality of conductive wires 122. In some embodiments, the first interconnect structure 513 may include a plurality of ILD layers. A photodetector 106 is disposed in the first substrate 104 and a first transistor 108 is disposed within and/or over the first substrate 104. The first transistor 108 may include source/drain regions 110, a gate dielectric layer 112, a gate electrode 114, and a sidewall spacer structure 116. A transfer transistor 514 is disposed over/within the first substrate 104 and overlies the photodetector 106. The transfer transistor 514 may, for example, comprise a transfer dielectric layer 511 and a transfer gate electrode 512 and may be configured to transfer accumulated charge from the photodetector 106. A first isolation structure 510 (e.g., a shallow trench isolation (STI) structure) is disposed along a sidewall of the transfer gate electrode 512. The photodetector 106 and the transfer transistor 514 are disposed within a pixel region 101a of the 3D IC 500a, and the first transistor 108 is disposed within a logic region 101b of the 3D IC 500a.

The second IC die 504 includes a second substrate 506 and a second interconnect structure 508 overlying the second substrate 506. The second interconnect structure 508 includes a second interconnect dielectric structure 520, a second plurality of conductive vias 522, and a second plurality of conductive wires 524. In some embodiments, the second interconnect dielectric structure 520 includes a plurality of ILD layers. A second transistor 515 overlies the second substrate 506. A trench capacitor 102 has a trench segment 102ts that fills a trench 126t defined by the second substrate 506 and at least a portion of the first interconnect structure 513. The trench segment 102ts of the trench capacitor 102 extends completely through a front-side 506f of the second substrate 506 to below a back-side 506b of the second substrate 506. The front-side 506f is opposite the back-side 506b. The trench capacitor 102 includes a first electrode 130 and a second electrode 134. The first electrode 130 is in direct contact and/or is directly electrically coupled to a conductive wire 122a of the first interconnect structure 118, and the second electrode 134 is in direct contact and/or is directly electrically coupled to a conductive via 522 of the second interconnect structure 508. The second transistor 515 and the trench capacitor 102 are disposed within the pixel region 101a. A conductive through-substrate via (TSV) 518 is disposed within the logic region 101b and extends from the front-side 506f to the back-side 506b of the second substrate 506. In some embodiments, an isolation structure (not shown) is disposed within the second substrate 506 and is spaced laterally between the trench capacitor 102 and the conductive TSV 518. In some embodiments, an isolation structure 516 is disposed within the second substrate 506 and is spaced laterally between the trench capacitor 102 and second transistor 515.

By decreasing an area of the trench capacitor 102 over the first substrate 104, electromagnetic radiation 501 that interacts with (e.g., reflects off of and/or is absorbed by) the trench capacitor 102 will be reduced. This may decrease non-uniformity of electromagnetic radiation 501 received by each photodetector 106 in an array of photodetectors 106 disposed across the first substrate 104. This may increase noise performance of the 3D IC 500a.

Figure 5B:
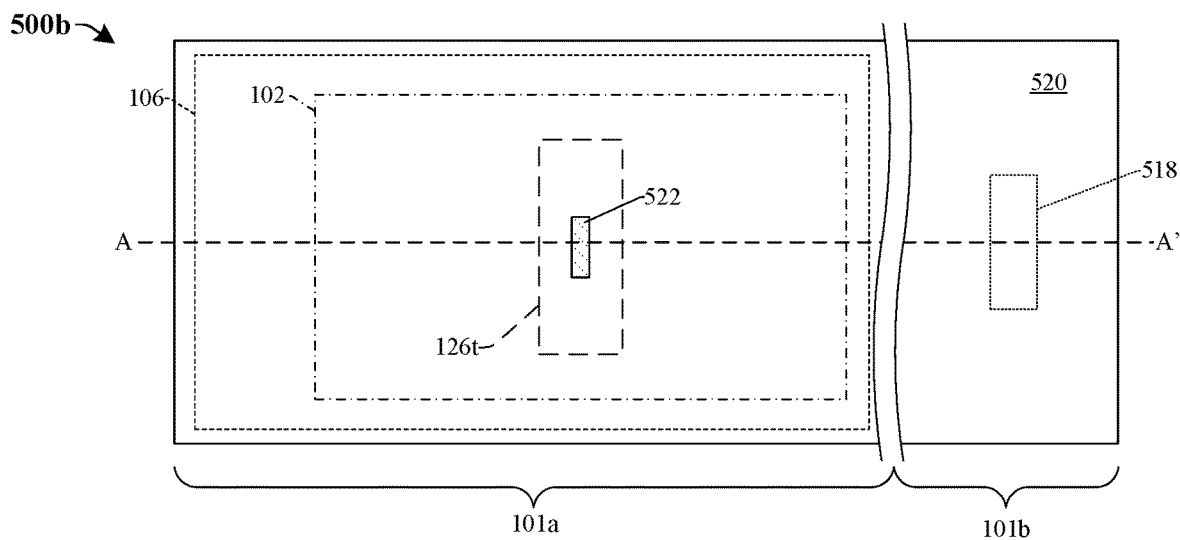
FIG. 5B illustrates a top view of some alternative embodiments of the 3D IC of FIG. 5A.

FIG. 5B illustrates a top view 500b of some alternative embodiments of the 3D IC 500a of FIG. 5A according to the line A-A'. As illustrated in FIG. 5B, the trench capacitor 102 is laterally spaced between outer sides of the photodetector 106.

Figure 6A:
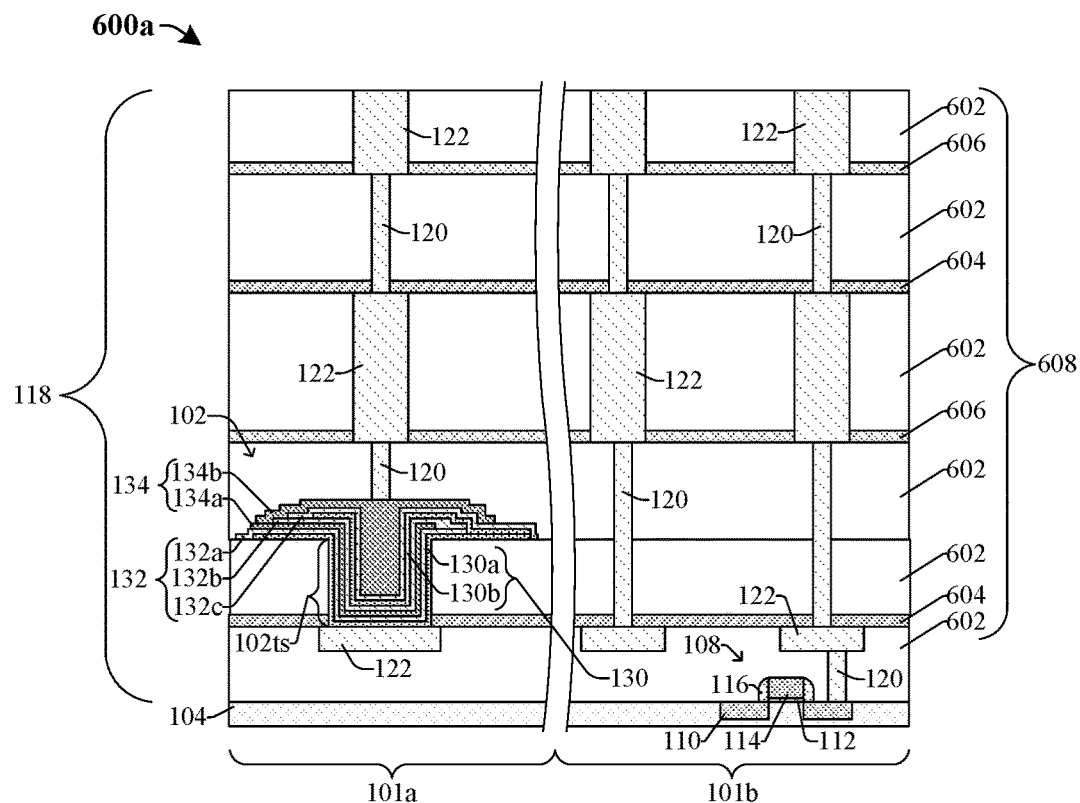
FIGS. 6A-B illustrate cross-sectional views of some alternative embodiments of the IC of FIG. 1.

FIG. 6A illustrates a cross-sectional view of an IC 600a according to some alternative embodiments of the IC 100 of FIG. 1.

The interconnect structure 118 includes an interconnect dielectric structure 608, a plurality of conductive vias 120, and a plurality of conductive wires 122. The interconnect dielectric structure 608 includes a plurality of inter-metal dielectric (IMD) layers 602, a first plurality of dielectric protection layers 604, and a second plurality of dielectric protection layers 606. The plurality of IMD layers 602 may, for example, each be or comprise an oxide (e.g., silicon dioxide), a low κ dielectric material, or the like. The first plurality of dielectric protection layers 604 may, for example, each be or comprise a nitride (such as silicon nitride), or the like. The second plurality of dielectric protection layers 606 may, for example, each be or comprise a carbide (such as silicon carbide), or the like. A bottom surface of the trench capacitor 102 is aligned with a bottom surface of a conductive via 120 disposed within the logic region 101b and a top surface of the trench capacitor 102 is disposed vertically below a top surface of the conductive via 120 disposed within the logic region 101b.

Figure 6B:
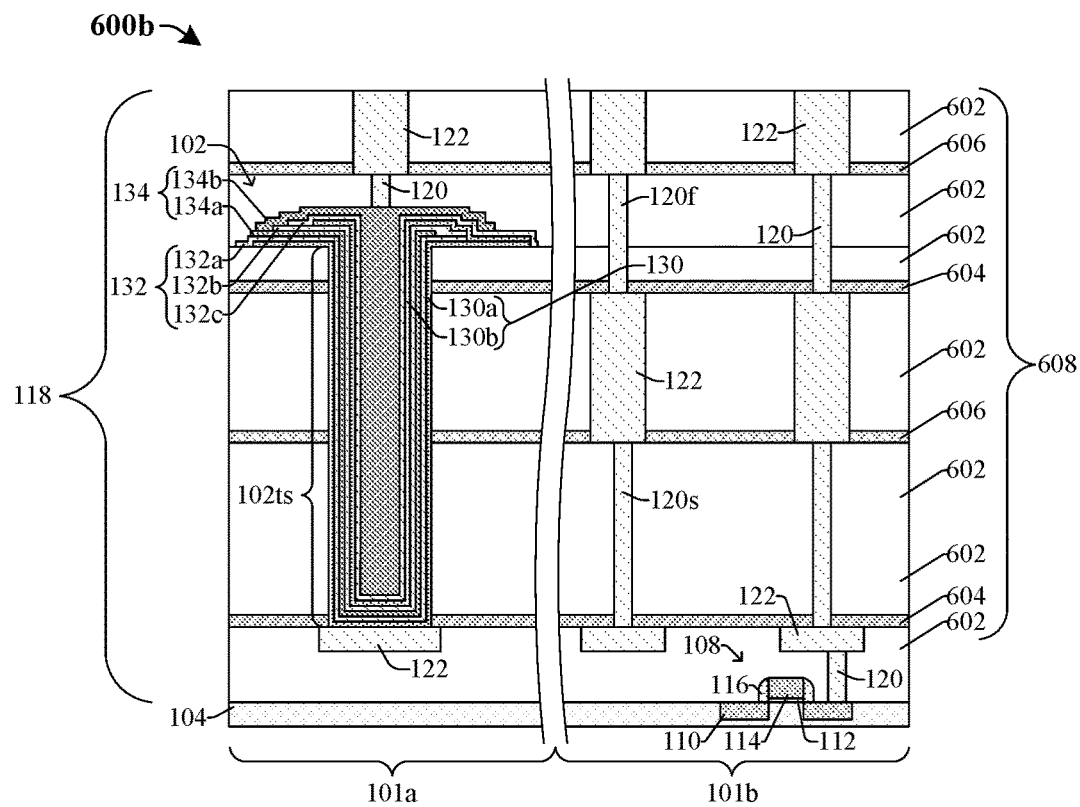

FIG. 6B illustrates a cross-sectional view of an IC 600b according to some alternative embodiments of the IC 600a of FIG. 6A.

A trench segment 102ts of the trench capacitor 102 extends from a first conductive via 120f of the plurality of conductive vias 120 to a second conductive via 120s of the conductive vias 120. The first conductive via 120f is separated from the second conductive via 120s by a conductive wire 122. In some embodiments, a height of the trench segment 102ts of the trench capacitor 102 of FIG. 6B is greater than a height of the trench segment 102ts of the trench capacitor 102 of FIG. 6A. In such embodiments, by virtue of the greater height of the trench segment 102ts, an area between the first and second electrodes 130, 134 may be increased. This may increase a capacitance density of the trench capacitor 102 of FIG. 6B.

FIGS. 7A-7B through 17A-17B illustrate a series of various views of some embodiments of a method for forming an integrated circuit (IC) having a trench capacitor overlying a substrate. Figures with a suffix of "A" illustrate a cross-sectional view of the IC during various formation processes. Figures with a suffix of "B" illustrate a top view taken along the line A-A' of Figs. with a suffix of "A". Although the various views shown in FIGS. 7A-7B through 17A-17B are described with reference to a method of forming the IC, it will be appreciated that the structures shown in FIGS. 7A-7B through 17A-17B are not limited to the method of formation but rather may stand alone separate of the method.

Figure 7A:
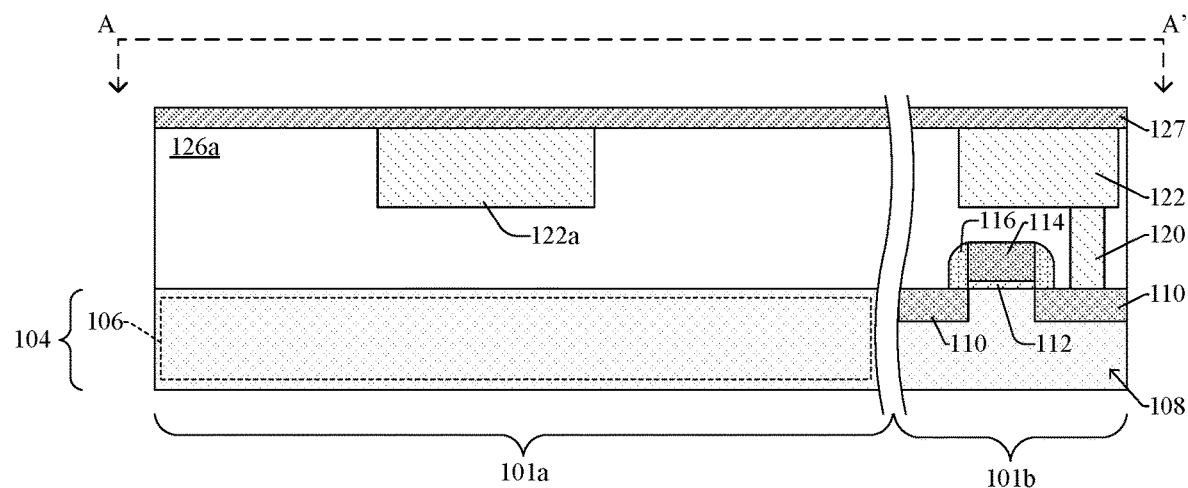
FIGS. 7A-7B through 17A-17B illustrate a series of various views of some embodiments of a method for forming an IC having a trench capacitor overlying a substrate.
Figure 7B:
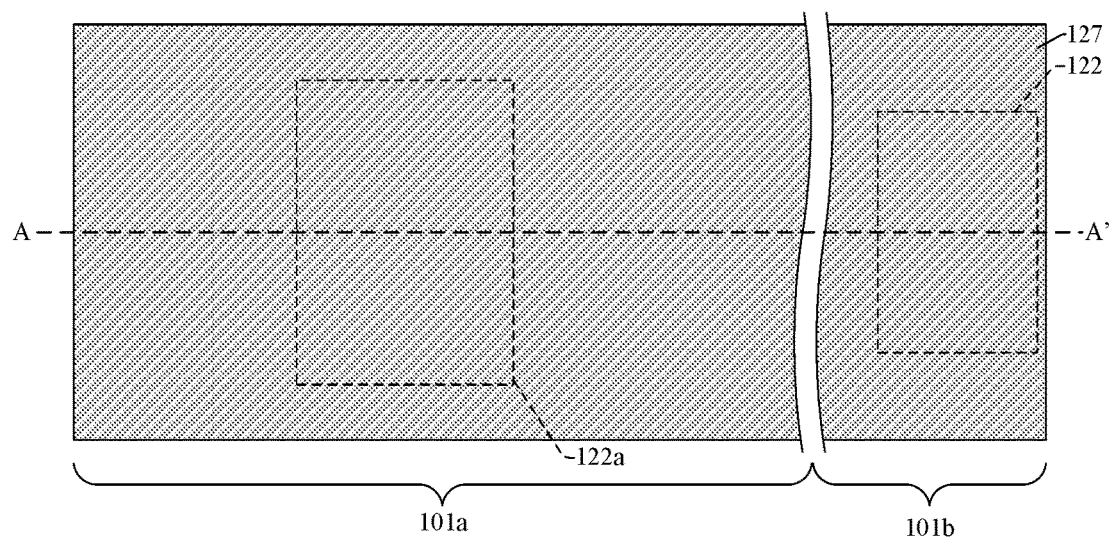

As shown in cross-sectional view 700a and top view 700b of FIGS. 7A-7B, a substrate 104 is provided and a photodetector 106 is formed in a pixel region 101a. In some embodiments, the substrate 104 may, for example, be a bulk substrate (e.g., a bulk silicon substrate), a silicon-on-insulator (SOI) substrate, or some other suitable substrate comprising a first doping type (e.g., p-type). The photodetector 106 is a region of the substrate 104 having a second doping type (e.g., n-type) opposite the first doping type. In some embodiments, the photodetector 106 may be formed by a selective ion implantation process that utilizes a masking layer (not shown) on a front-side of the substrate 104 to selectively implant ions into the substrate 104. Further, a transistor 108 is formed over the front-side of the substrate 104. In some embodiments, a process for forming the transistor 108 includes depositing and/or growing (e.g., chemical vapor deposition (CVD), physical vapor deposition (PVD), atomic layer deposition (ALD), thermal oxidation, etc.) a gate dielectric film on the front-side of the substrate 104. Next, a gate electrode layer may be deposited on the gate dielectric film. Subsequently, the gate dielectric film and the gate electrode layer are patterned (e.g., by a photolithography/etching process) to form a gate dielectric layer 112 and a gate electrode 114, respectively. A selective ion implantation process may be performed to selectively implant ions into the substrate 104, thereby defining the source/drain regions 110 on opposing sides of the gate electrode 114. Further, a sidewall spacer structure 116 may, for example, be formed by: depositing (e.g., by CVD, PVD, ALD, etc.) a spacer layer over the substrate 104, the gate dielectric layer 112, and the gate electrode 114; and etching back the spacer layer, thereby defining the sidewall spacer structure 116. In some embodiments, the gate electrode 114 may, for example, be or comprise polysilicon, aluminum, or the like. In further embodiments, the gate dielectric layer 112 may, for example, be or comprise an oxide (e.g., silicon dioxide), a high κ dielectric material, or the like. In some embodiments, the transistor 108 is formed in a logic region 101b.

Also shown in FIGS. 7A-7B, a first inter-level dielectric (ILD) layer 126a is deposited over the substrate 104. In some embodiments, the first ILD layer 126a may, for example, be deposited or grown by CVD, PVD, ALD, or another suitable growth or deposition process. A conductive via 120 is formed over the substrate 104 and conductive wires 122 are formed over the substrate 104. A lower conductive wire 122a of the conductive wires 122 is formed in the pixel region 101a and overlies the photodetector 106. In some embodiments, the conductive via 120 and/or the conductive wires 122 are formed by separate single damascene processes. In some embodiments, the conductive via 120 and/or the conductive wires 122 may each, for example, be or comprise aluminum, copper, tungsten, or the like. A dielectric protection layer 127 is formed over the first ILD layer 126a and the lower conductive wire 122a. In some embodiments, the dielectric protection layer 127 may, for example, be or comprise silicon carbide, silicon nitride, or the like.

Figure 8A:
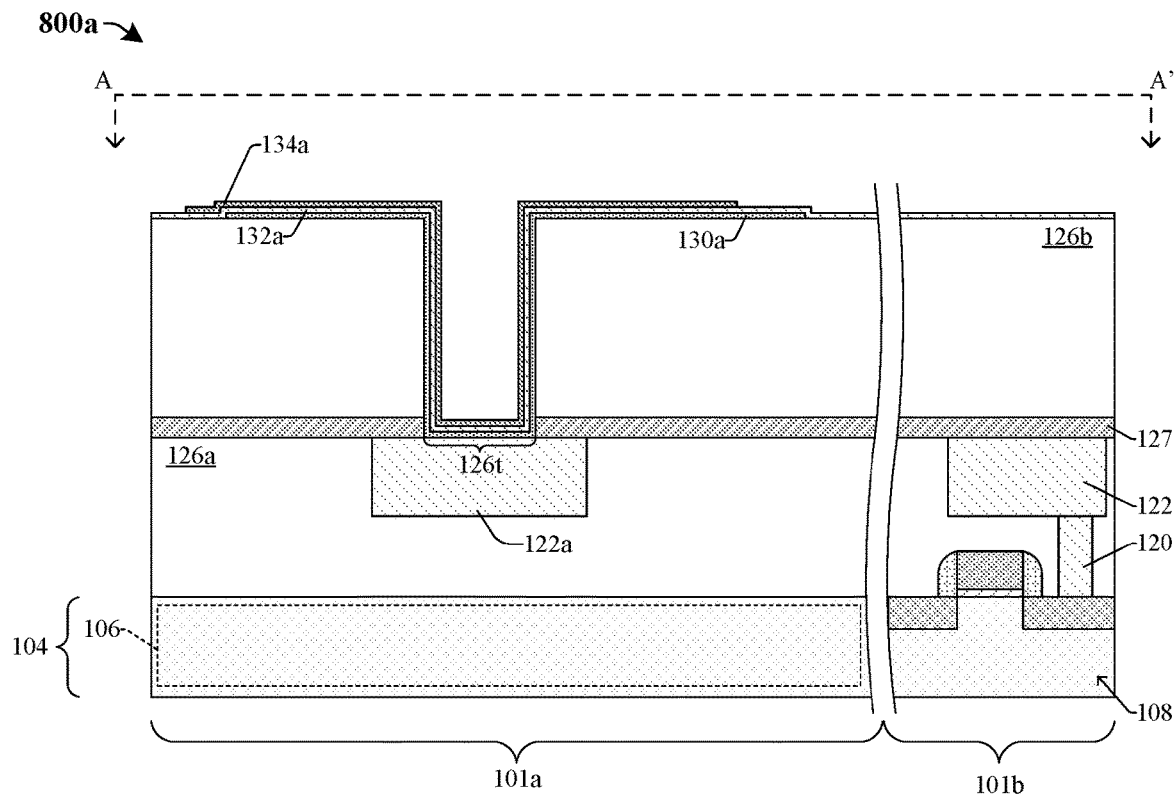
Figure 8B:
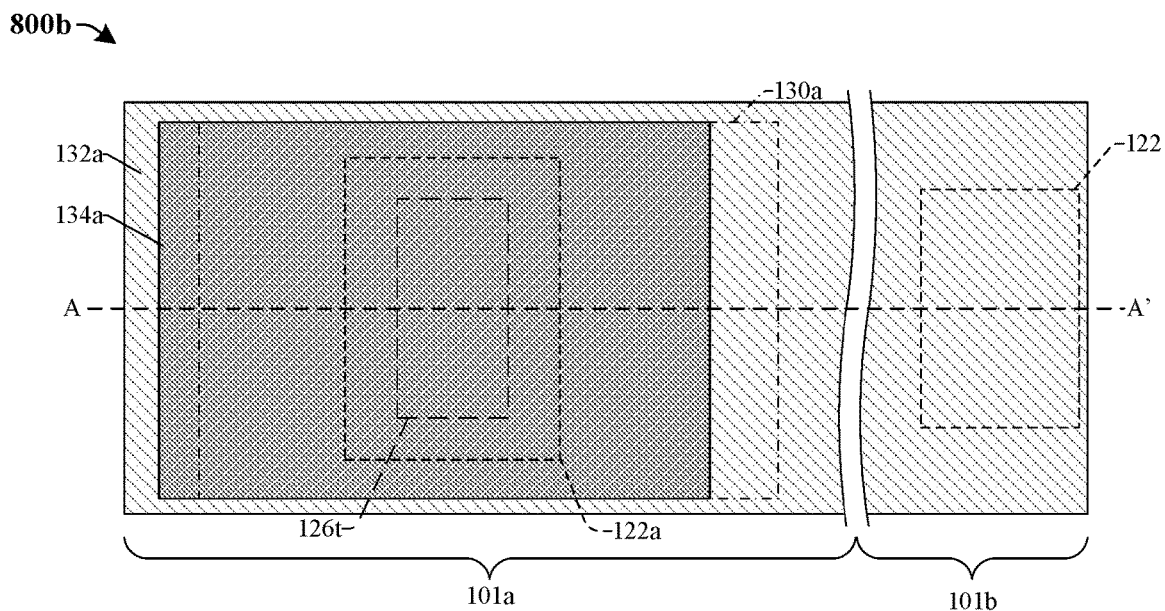

As shown in cross-sectional view 800a and top view 800b of FIGS. 8A-8B, a second ILD layer 126b is formed over the dielectric protection layer 127. The second ILD layer 126b may, for example, be or comprise an oxide (e.g., silicon dioxide), a low κ dielectric material, or the like. The second ILD layer 126b and the dielectric protection layer 127 are patterned to define a trench 126t in the second ILD layer 126b and the dielectric protection layer 127. The patterning process may include: forming a masking layer (not shown) over the second ILD layer 126b; exposing unmasked regions of the second ILD layer 126b and the dielectric protection layer 127 to one or more etchants, thereby forming the trench 126t; and performing a removal process to remove the masking layer. A lower first electrode layer 130a is formed over the second ILD layer 126b and the lower conductive wire 122a. In some embodiments, a process for forming the lower first electrode layer 130a includes: depositing (e.g., by CVD, PVD, sputtering, etc.) an electrode layer (e.g., tantalum, tantalum nitride, titanium, titanium nitride, or the like) over the second ILD layer 126b; and etching the electrode layer according to a masking layer (not shown), thereby defining the lower first electrode layer 130a. In some embodiments, the lower first electrode layer 130a may, for example, be or comprise a first conducive material underlying a second conductive material. In further embodiments, the first conductive material may, for example, be or comprise tantalum, tantalum nitride, or the like and/or may have a thickness within a range of about 200 to 400 Angstroms. In such embodiments, the second conductive material may, for example, be or comprise titanium nitride and/or may have a thickness within a range of about 100 to 200 Angstroms.

Also shown in FIGS. 8A-8B, a first capacitor dielectric layer 132a is deposited (e.g., by CVD, PVD, ALD, etc.) over the second ILD layer 126b and the lower first electrode layer 130a. The first capacitor dielectric layer 132a may, for example, be or comprise a high κ dielectric material, some other suitable dielectric(s), or any combination of the foregoing. The high κ dielectric material may, for example, be or comprise hafnium oxide, zirconium oxide, aluminum oxide, tantalum oxide, titanium oxide, or some other suitable high κ dielectric(s), or any combination of the foregoing. In some embodiments, the first capacitor dielectric layer 132a may, for example, have a thickness within a range of about 60 to 200 Angstroms.

Also shown in FIGS. 8A-8B, a lower second electrode layer 134a is formed over the first capacitor dielectric layer 132a. In some embodiments, a process for forming the lower second electrode layer 134a includes: depositing (e.g., by CVD, PVD, sputtering, etc.) an electrode layer (e.g., tantalum, tantalum nitride, titanium, titanium nitride, or the like) over the first capacitor dielectric layer 132a; and etching the electrode layer according to a masking layer (not shown), thereby defining the lower second electrode layer 134a. In such embodiments, the first capacitor dielectric layer 132a may act as an etch stop layer during the aforementioned etching process. In further embodiments, the lower second electrode layer 134a may, for example, be or comprise a nitride, titanium nitride, or the like and/or may have a thickness within a range of about 200 to 400 Angstroms.

Figure 9A:
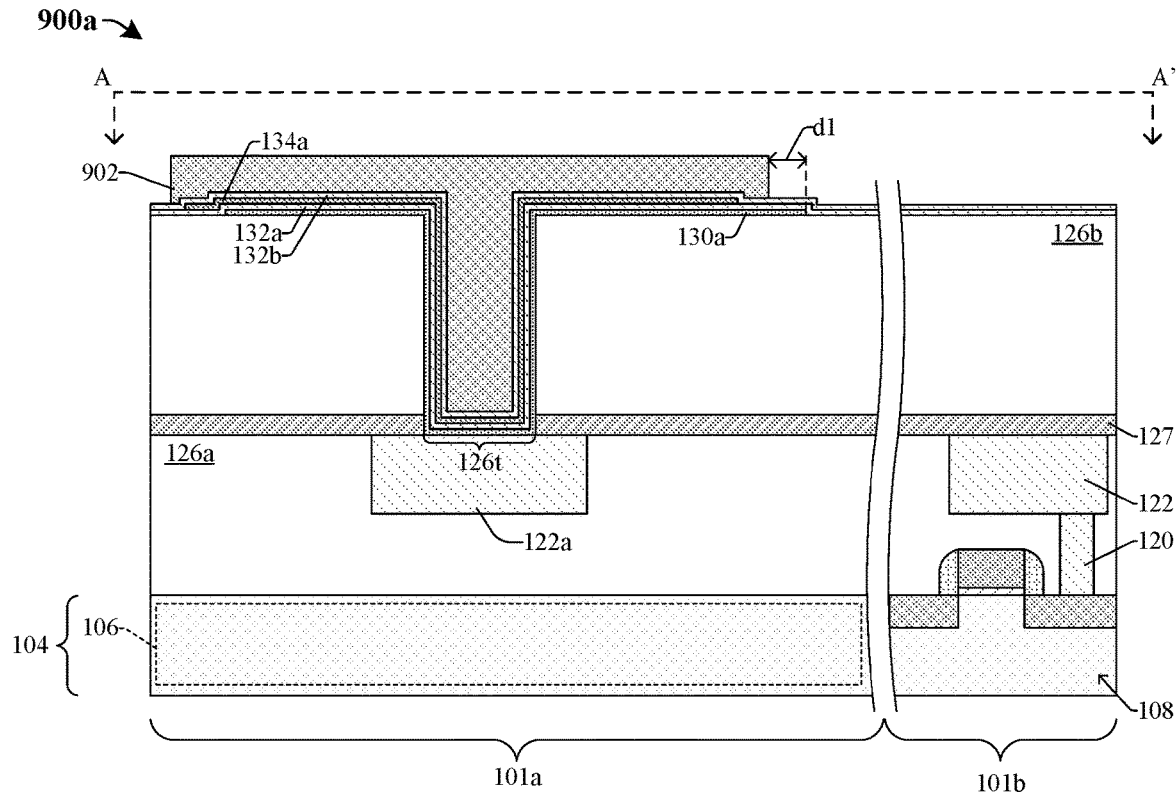
Figure 9B:
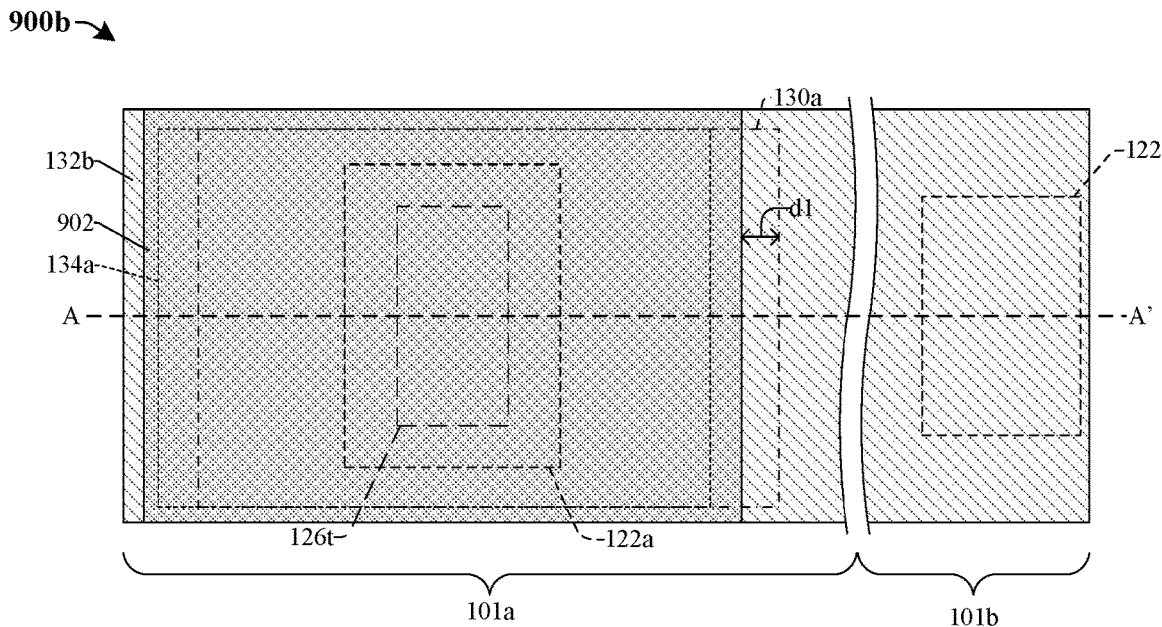

As shown in cross-sectional view 900a and top view 900b of FIGS. 9A-9B, a second capacitor dielectric layer 132b is deposited (e.g., by CVD, PVD, ALD, etc.) over the lower second electrode layer 134a. The second capacitor dielectric layer 132b may, for example, be or comprise a high κ dielectric material, some other suitable dielectric(s), or any combination of the foregoing. The high κ dielectric material may, for example, be or comprise hafnium oxide, zirconium oxide, aluminum oxide, tantalum oxide, titanium oxide, or some other suitable high κ dielectric(s), or any combination of the foregoing. In some embodiments, the second capacitor dielectric layer 132b may, for example, have a thickness within a range of about 60 to 200 Angstroms. Further, a first masking layer 902 is formed over the second capacitor dielectric layer 132b. The first masking layer 902 is laterally separated from a sidewall of the lower first electrode layer 130a by a distance d1. The distance d1 is within a range of about 15 to 30 nanometers.

Figure 10A:
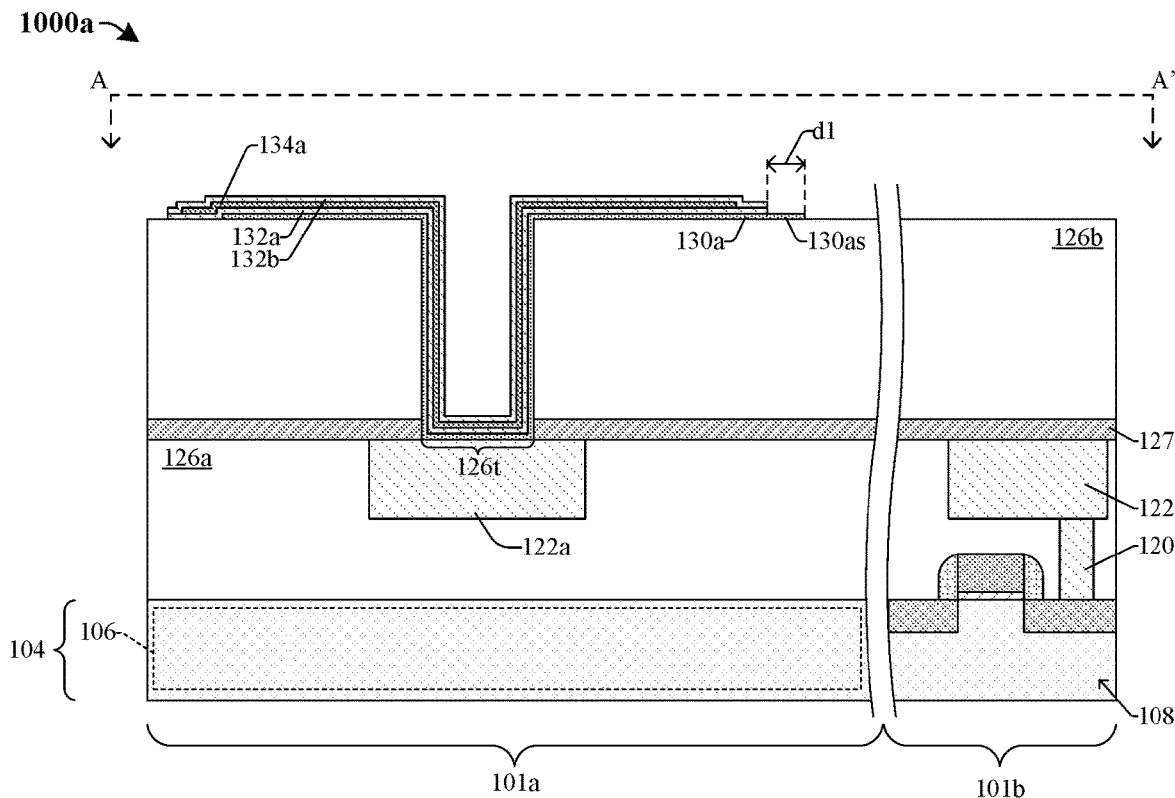
Figure 10B:
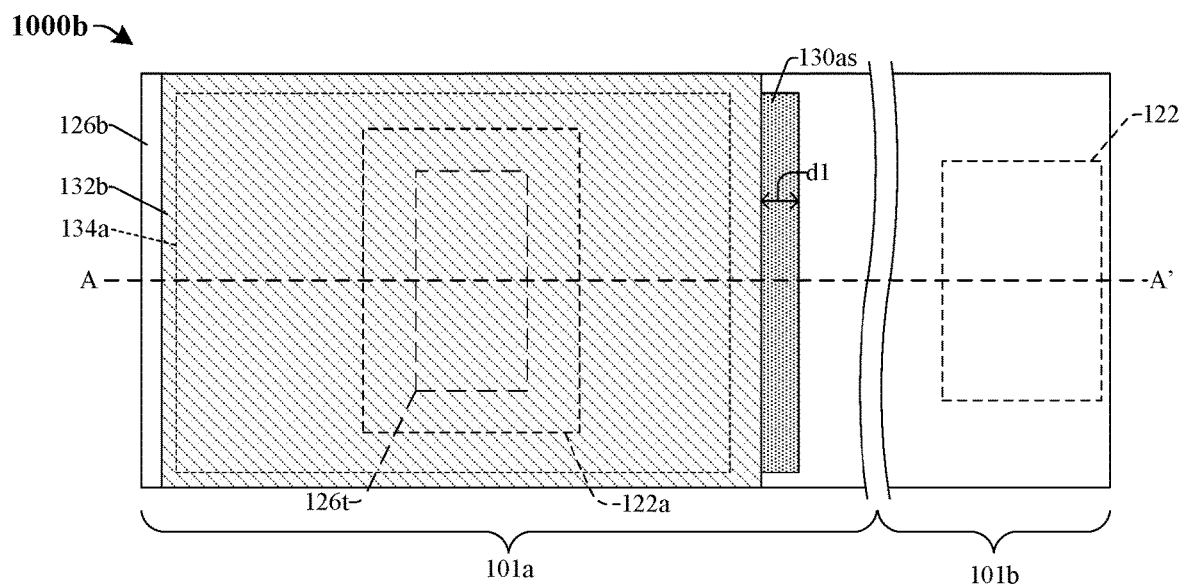

As shown in cross-sectional view 1000a and top view 1000b of FIGS. 10A-10B, an etching process is performed on the first and second capacitor dielectric layers 132a-b according to the first masking layer (902 of FIG. 9A). The etching process exposes a segment 130as of the lower first electrode layer 130a. In some embodiments, the segment 130as has a length equal to the distance d1. In further embodiments, after the etching process, a removal process is performed to remove the first masking layer (902 of FIG. 9A).

Figure 11A:
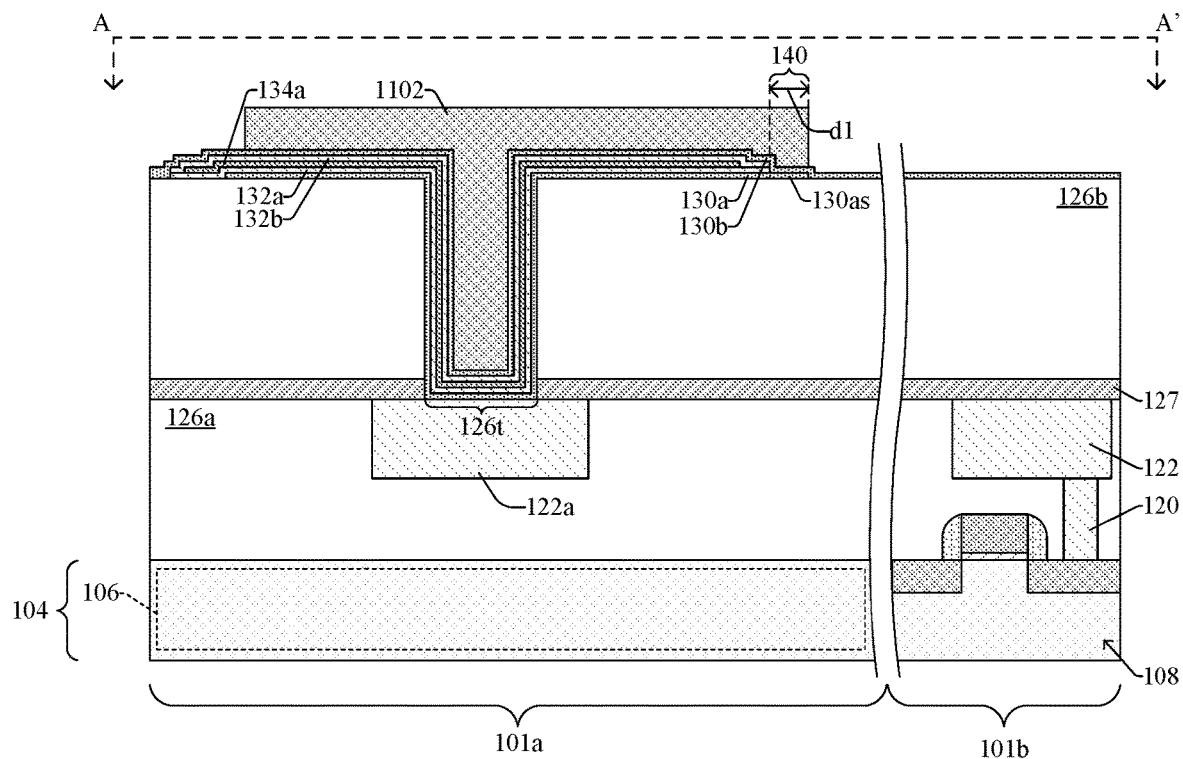
Figure 11B:
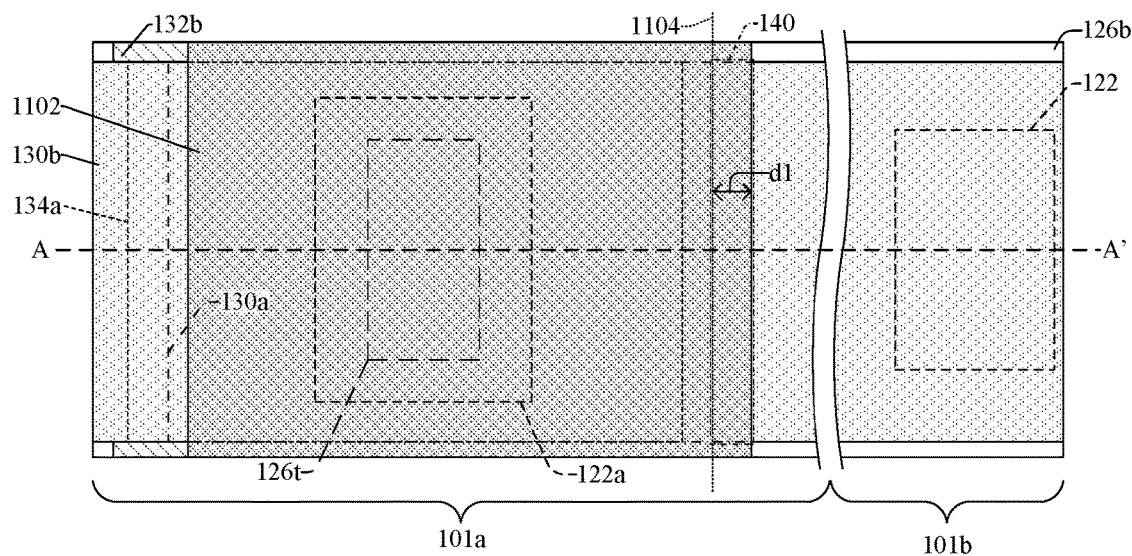

As shown in cross-sectional view 1100a and top view 1100b of FIGS. 11A-11B, an upper first electrode layer 130b is deposited over the second capacitor dielectric layer 132b and the lower first electrode layer 130a. The upper first electrode layer 130b overlies and directly contacts the segment 130as of the lower first electrode layer 130a in a first connection region 140. In some embodiments, the first connection region 140 has a length equal to the distance d1. Therefore, the upper first electrode layer 130b is electrically coupled to the lower first electrode layer 130a in the first connection region 140. In some embodiments, the first connection region 140 is defined from a sidewall of the lower first electrode layer 130a to a substantially straight line 1104, wherein the substantially straight line 1104 is aligned with a sidewall of the first and/or second capacitor dielectric layers 132a-b. In some embodiments, the upper first electrode layer 130b may be formed and/or deposited by CVD, PVD, sputtering, or another suitable deposition process and/or may have a thickness within a range of about 200 to 400 Angstroms. In some embodiments, the upper first electrode layer 130b may, for example, be or comprise titanium, a nitride, titanium nitride, or the like. Further, a second masking layer 1102 is formed over the upper first electrode layer 130b. The second masking layer 1102 covers the first connection region 140 and is configured to protect the lower and upper first electrode layers 130a-b in the first connection region 140 from subsequent processing steps (e.g., the etching process of FIGS. 12A-12B).

Figure 12A:
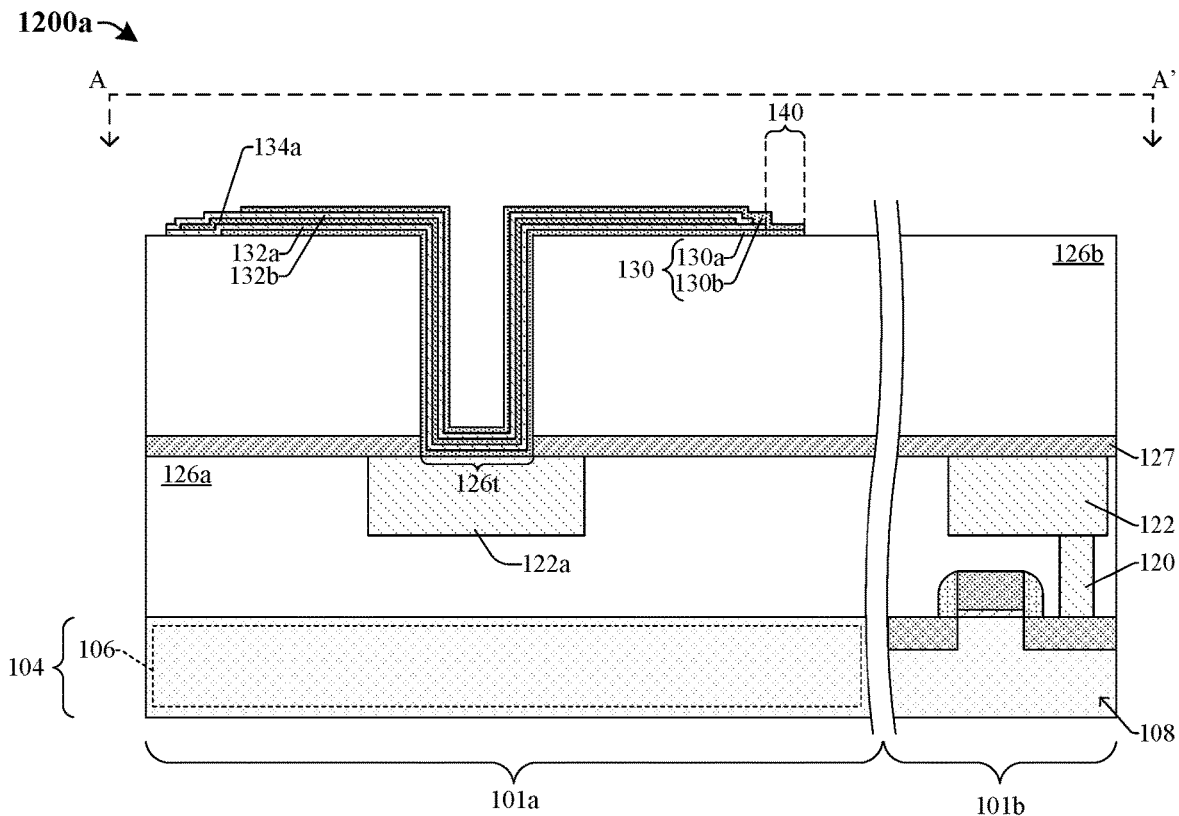
Figure 12B:
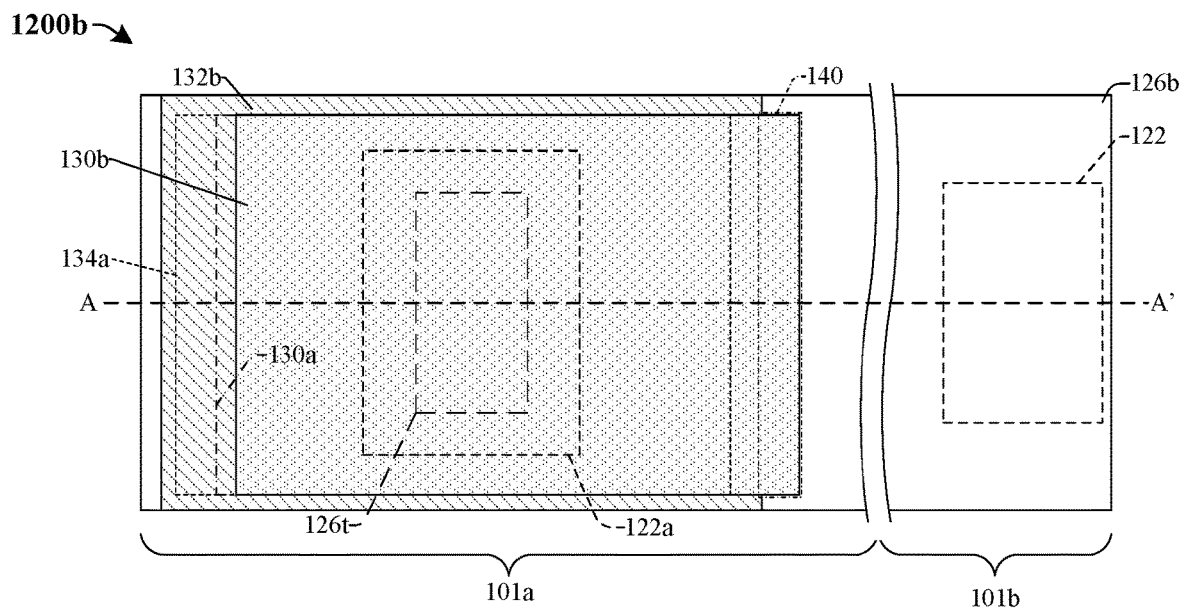

As shown in cross-sectional view 1200a and top view 1200b of FIGS. 12A-12B, an etching process is performed on the upper first electrode layer 130b according to the second masking layer (1102 of FIG. 11A), thereby defining the first electrode 130. The first electrode 130 includes the lower first electrode layer 130a and the upper first electrode layer 130b. In some embodiments the etching process may, for example, include performing a wet etch, a dry etch, or another suitable etch process. In further embodiments, the second masking layer (1102 of FIG. 11A) protects the lower and upper first electrode layers 130a-b in the first connection region 140 during the etching process. In further embodiments, after the etching process, a removal process is performed to remove the second masking layer (1102 of FIG. 11A).

Figure 13A:
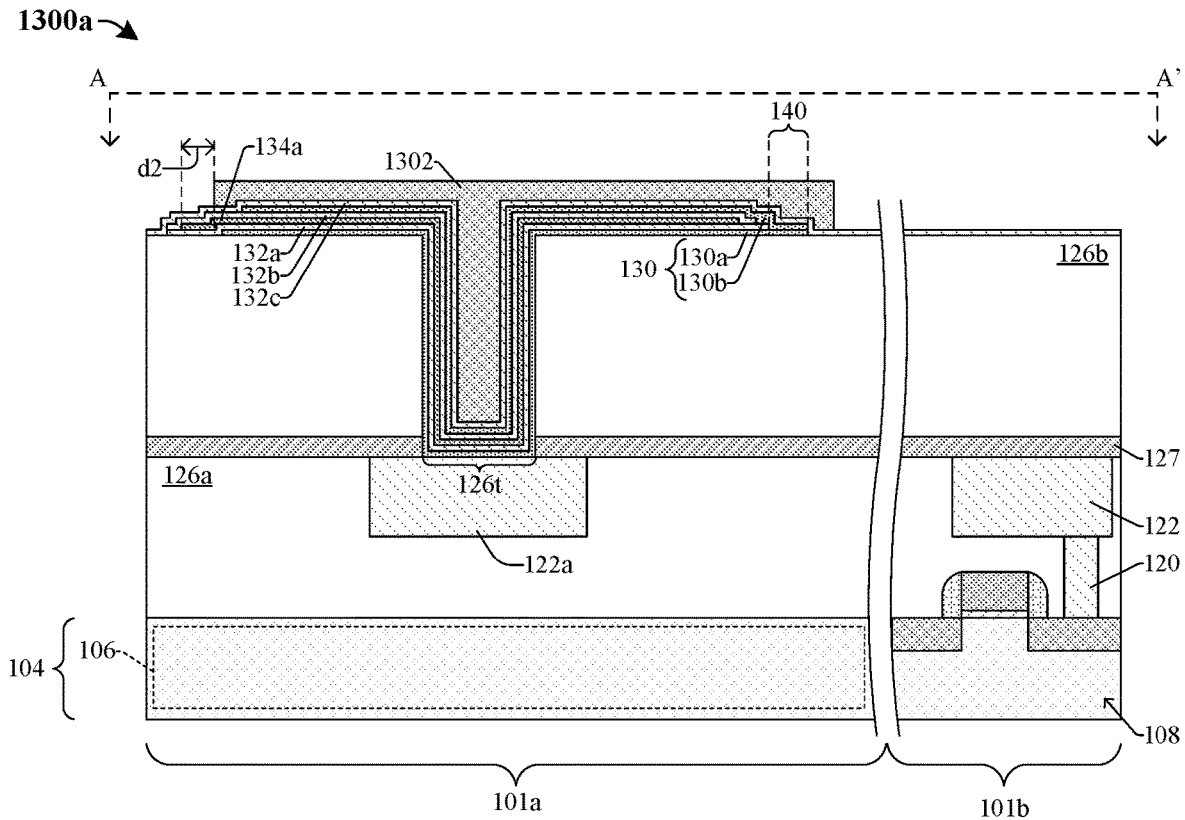
Figure 13B:
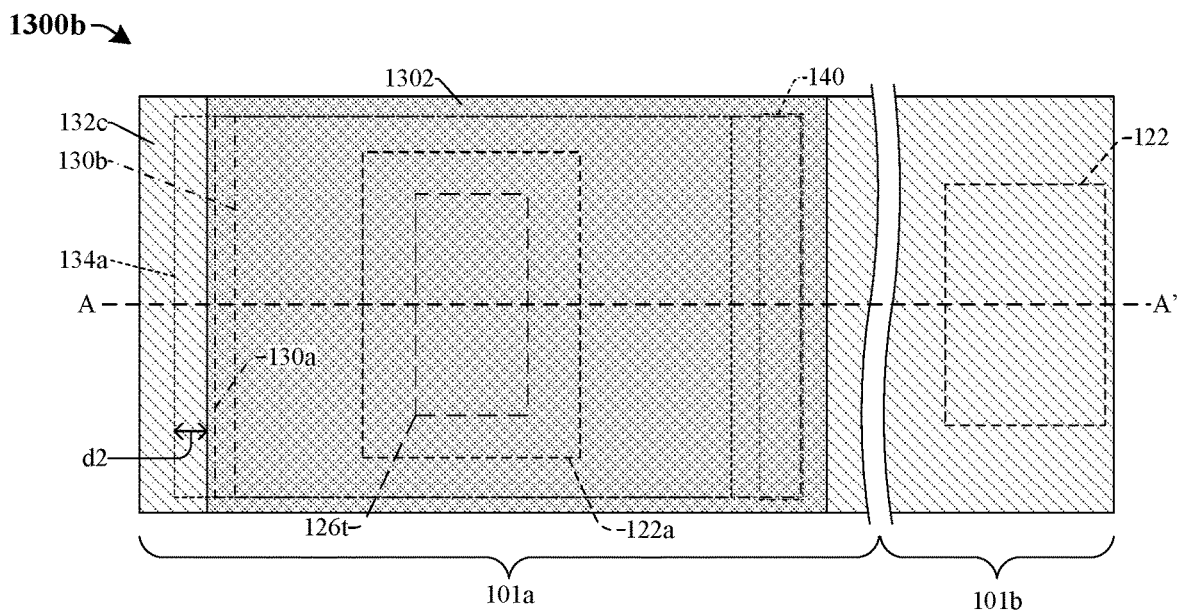

As shown in cross-sectional view 1300a and top view 1300b of FIGS. 13A-13B, a third capacitor dielectric layer 132c is deposited over the upper first electrode layer 130b. In some embodiments, the third capacitor dielectric layer 132c may, for example, be deposited or grown by CVD, PVD, ALD, or another suitable growth or deposition process. The third capacitor dielectric layer 132c may, for example, be or comprise a high κ dielectric material, some other suitable dielectric(s), or any combination of the foregoing. The high κ dielectric material may, for example, be or comprise hafnium oxide, zirconium oxide, aluminum oxide, tantalum oxide, titanium oxide, or some other suitable high κ dielectric(s), or any combination of the foregoing. In some embodiments, the third capacitor dielectric layer 132c may, for example, have a thickness within a range of about 60 to 200 Angstroms. Further, a third masking layer 1302 is formed over the third capacitor dielectric layer 132c. The third masking layer 1302 is laterally separated from a sidewall of the lower second electrode layer 134a by a distance d2. The distance d2 is within a range of about 15 to 30 nanometers.

Figure 14A:
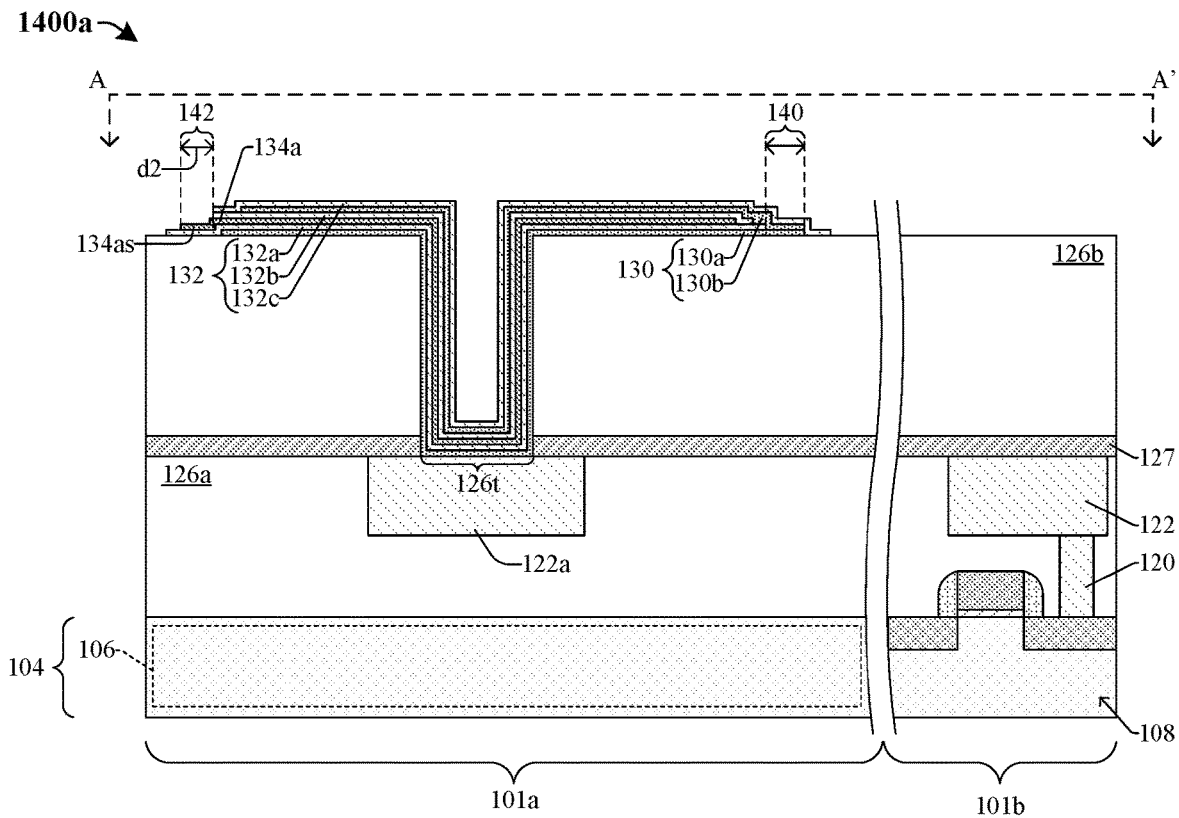
Figure 14B:
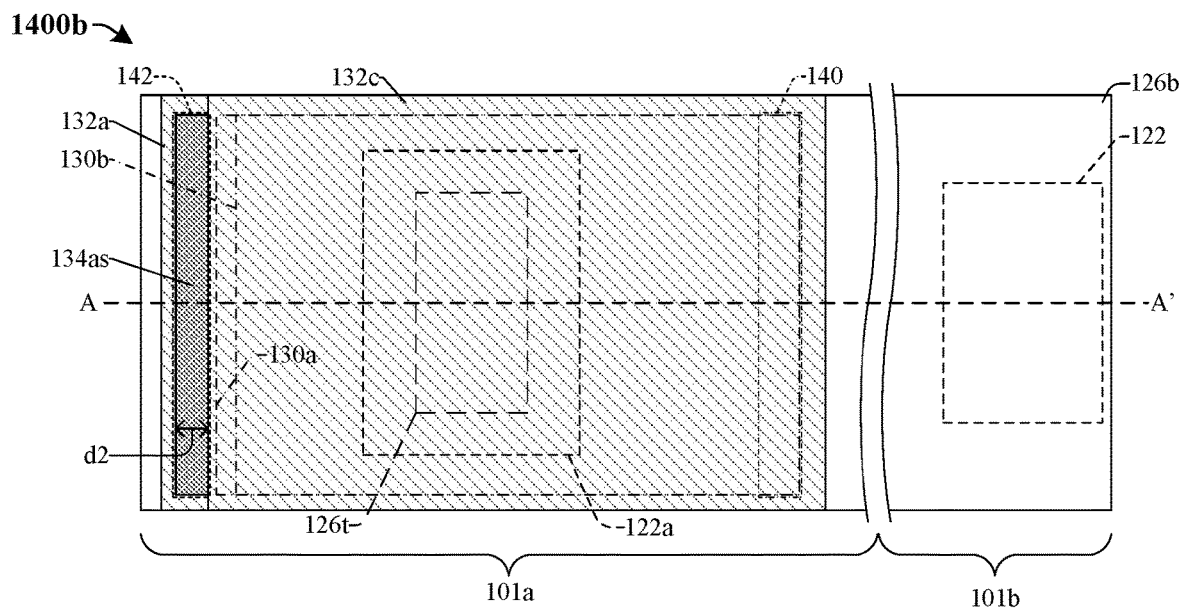

As shown in cross-sectional view 1400a and top view 1400b of FIGS. 14A-14B, an etching process is performed on the second and third capacitor dielectric layers 132b-c according to the third masking layer (1302 of FIG. 13A), thereby defining the capacitor dielectric structure 132. The etching process exposes a segment 134as of the lower second electrode layer 134a. In some embodiments, the segment 134as has a length equal to the distance d2. In further embodiments, after the etching process, a removal process is performed to remove the third masking layer (1302 of FIG. 13A).

Figure 15A:
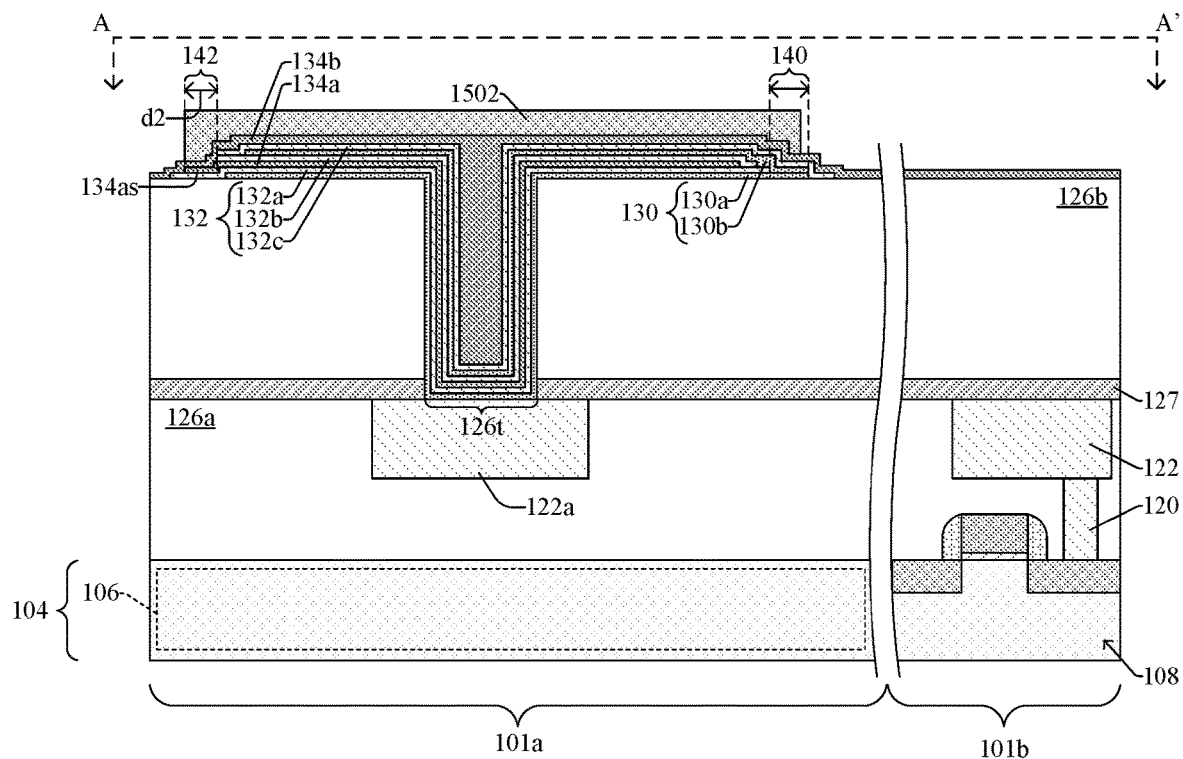
Figure 15B:
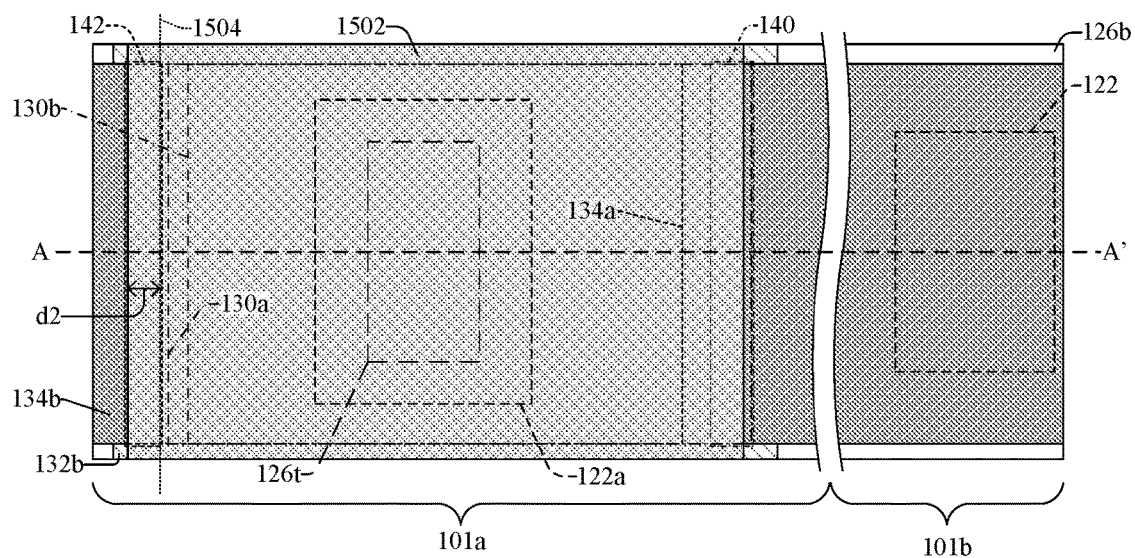

As shown in cross-sectional view 1500a and top view 1500b of FIGS. 15A-15B, an upper second electrode layer 134b is deposited over the third capacitor dielectric layer 132c and the lower second electrode layer 134a. The upper second electrode layer 134b overlies and directly contacts the segment 134as of the lower second electrode layer 134a in a second connection region 142. In some embodiments, the second connection region 142 has a length equal to the distance d2. In some embodiments, the second connection region 142 is defined from a sidewall of the lower second electrode layer 134a to a substantially straight line 1504, wherein the substantially straight line 1504 is aligned with a sidewall of the second and/or third capacitor dielectric layers 132b-c. In some embodiments, the upper second electrode layer 134b may be formed and/or deposited by CVD, PVD, sputtering, or another suitable deposition process and/or may have a thickness within a range of about 200 to 400 Angstroms. Further, a fourth masking layer 1502 is formed over the upper second electrode layer 134b. The fourth masking layer 1502 covers the second connection region 142 and is configured to protect the lower and upper second electrode layers 134a-b in the second connection region 142 from subsequent processing steps (e.g., a subsequent etch process).

Figure 16A:
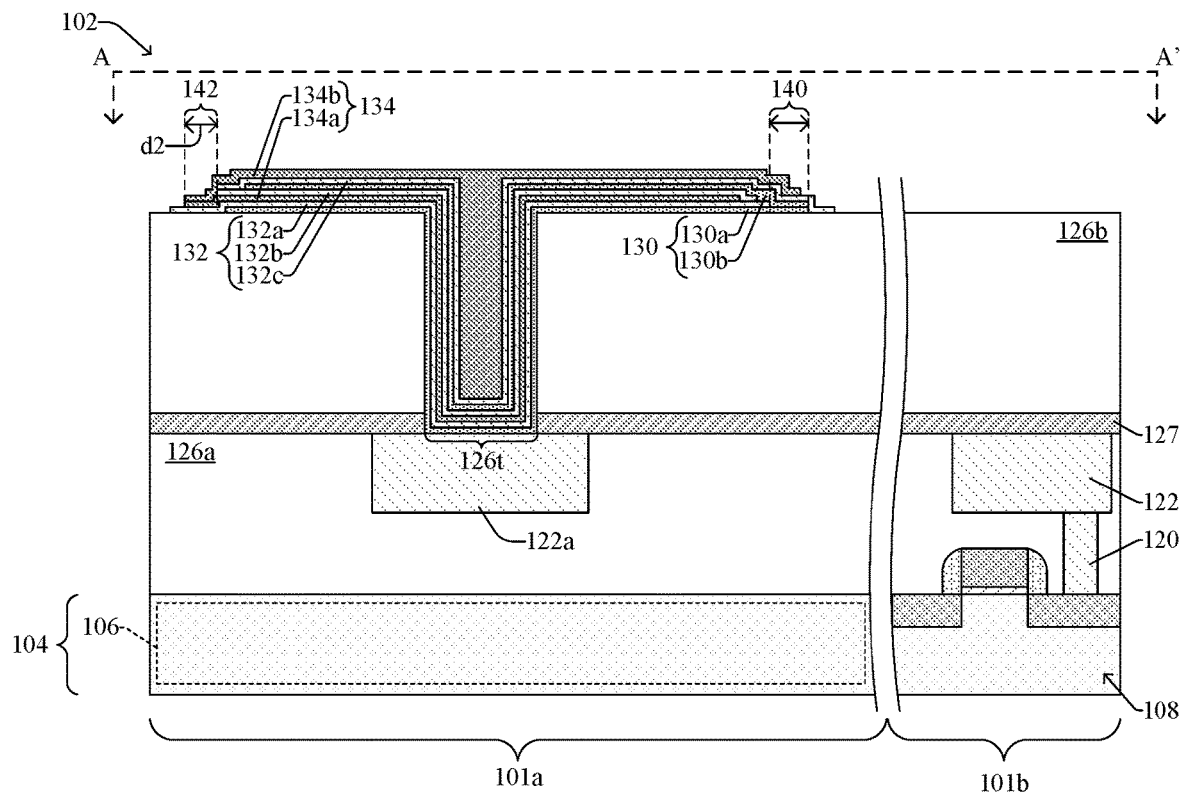
Figure 16B:
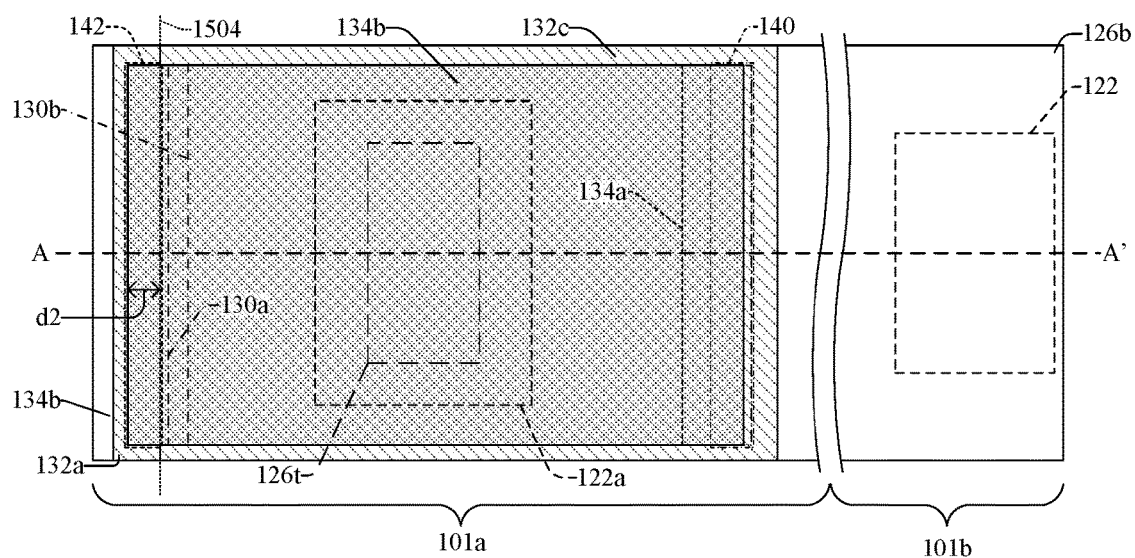

As shown in cross-sectional view 1600a and top view 1600b of FIGS. 16A-16B, an etching process is performed on the upper second electrode layer 134b according to the fourth masking layer (1502 of FIG. 15A), thereby defining the second electrode 134 and the trench capacitor 102. The second electrode 134 includes the lower second electrode layer 134a and the upper second electrode layer 134b. The trench capacitor 102 includes the first and second electrodes 130, 134 and the capacitor dielectric structure 132. In some embodiments the etching process may, for example, include performing a wet etch, a dry etch, or another suitable etch process. In further embodiments, the fourth masking layer (1502 of FIG. 15A) protects the lower and upper second electrode layers 134a-b in the second connection region 142 during the etching process. In further embodiments, after the etching process, a removal process is performed to remove the fourth masking layer (1502 of FIG. 15A).

Figure 17A:
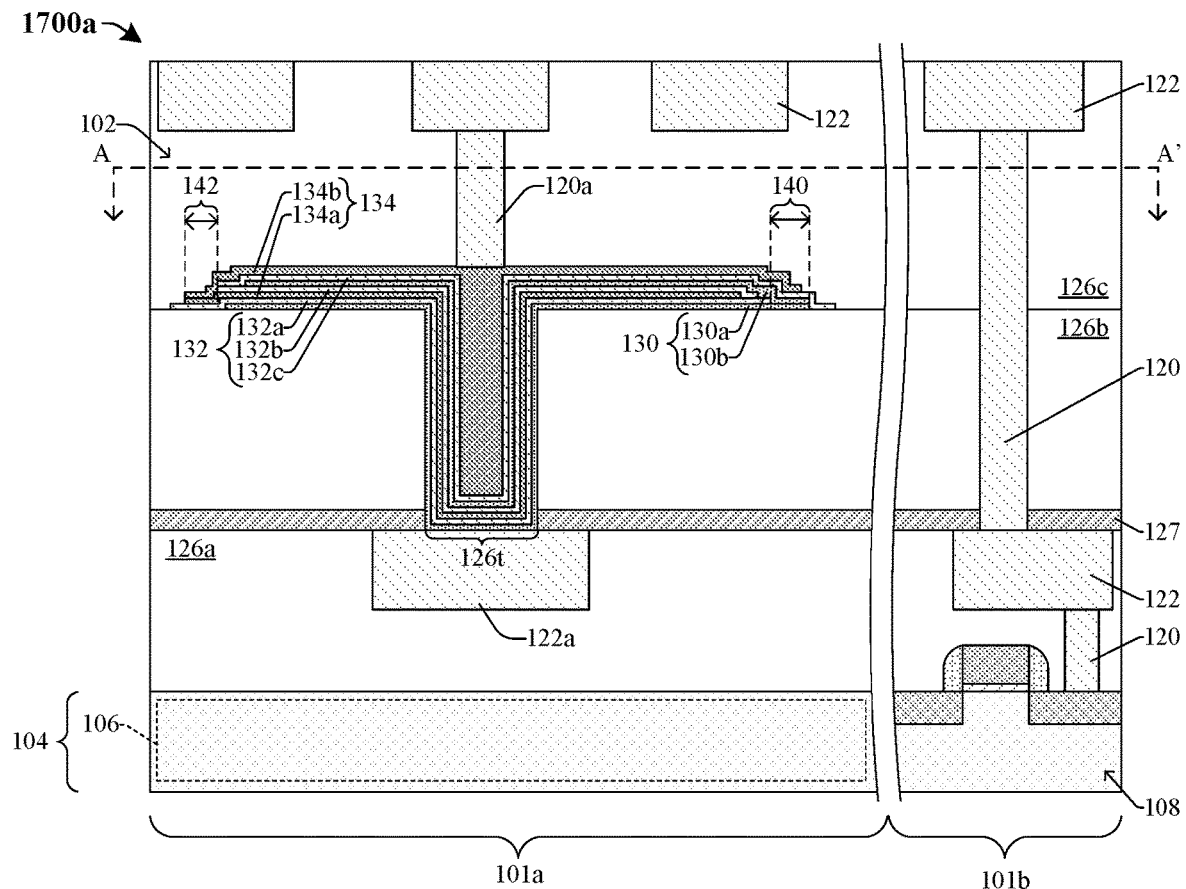
Figure 17B:
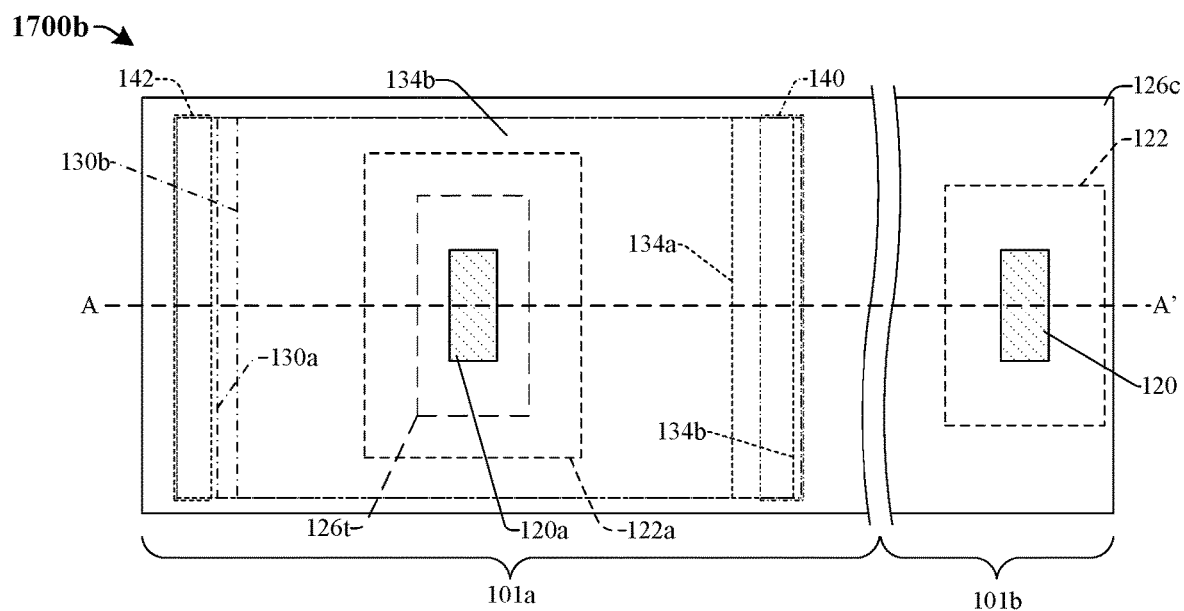

As shown in cross-sectional view 1700a and top view 1700b of FIGS. 17A-17B, a third ILD layer 126c is deposited over the trench capacitor 102 and the second ILD layer 126b. The third ILD layer 126c may be deposited or grown, for example, by CVD, PVD, ALD, or another suitable growth or deposition process. An upper conductive via 120a is formed directly over the trench capacitor 102. In some embodiments, the upper conducive via 120a is the only conductive via directly contacting the trench capacitor 102. A conductive via 120 is formed over the conductive wire 122 in the logic region 101b, and a plurality of conductive wires 122 are formed in the third ILD layer 126c overlying a respective conductive via 120. In some embodiments, the conductive via 120, the upper conductive via 120a, and/or the conductive wires 122 are formed by a single damascene process or a dual damascene process. In some embodiments, the conductive via 120, the upper conductive via 120a, and/or the conductive wires 122 may each, for example, be or comprise aluminum, copper, tungsten, or the like.

Figure 18:
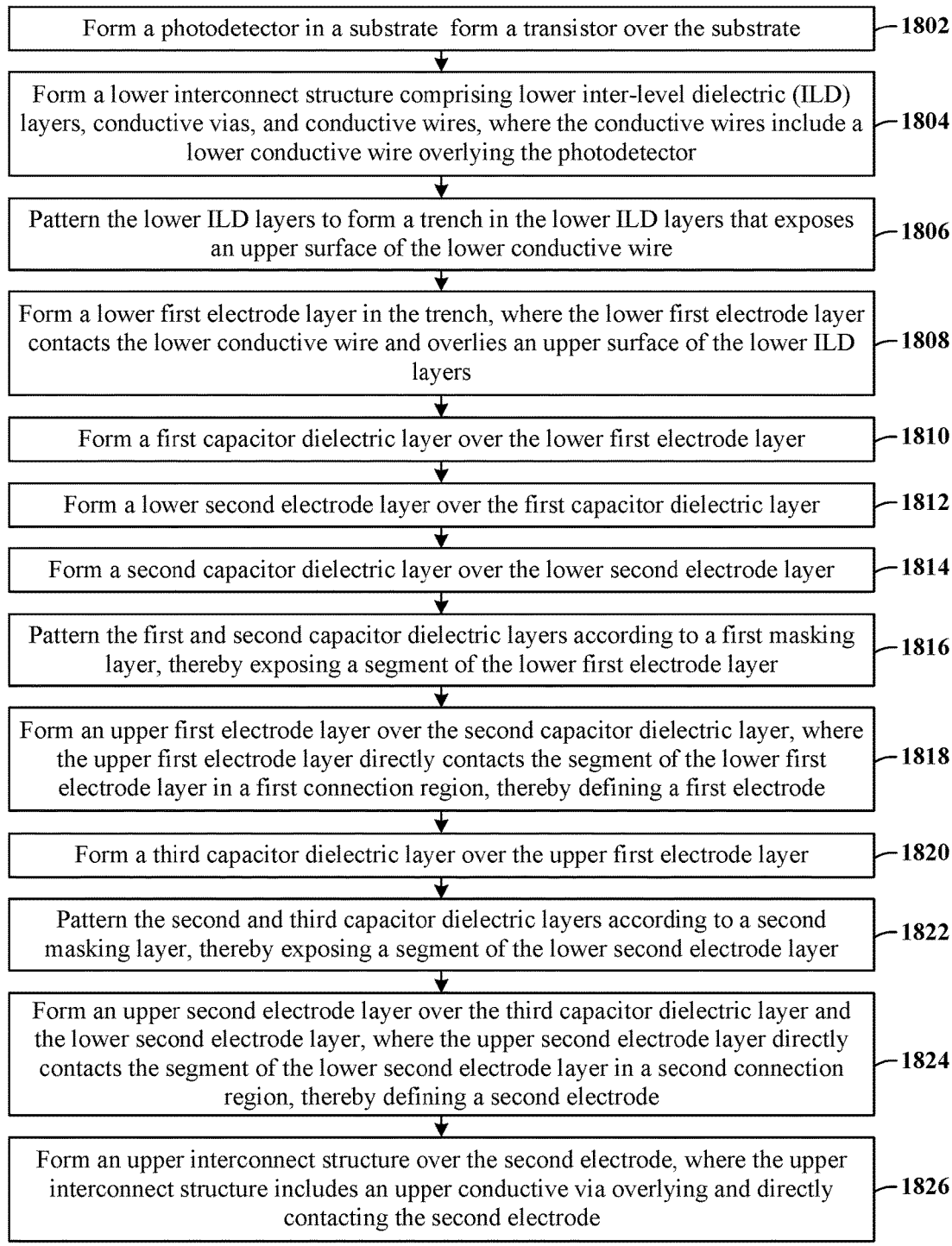
FIG. 18 illustrates a flowchart of some embodiments of a method for forming an IC having a trench capacitor overlying a substrate.

FIG. 18 illustrates a method 1800 of forming an integrated circuit (IC) having a trench capacitor overlying a photodetector according to the present disclosure. Although the method 1800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, a photodetector is formed in a substrate and a transistor is formed over the substrate. FIGS. 7A-7B illustrate various views of some embodiments corresponding to act 1802.

At act 1804, a lower interconnect structure is formed over the substrate and comprises lower inter-level dielectric (ILD) layers, conductive vias, and conductive wires. The conductive wires include a lower conductive wire overlying the photodetector. FIGS. 7A-7B illustrate various views of some embodiments corresponding to act 1804.

At act 1806, the lower ILD layers are patterned to form a trench in the lower ILD layers that exposes an upper surface of the lower conductive wire. FIGS. 8A-8B illustrate various views of some embodiments corresponding to act 1806.

At act 1808 a lower first electrode layer is formed in the trench, wherein the lower first electrode layer contacts the lower conductive wire and overlies an upper surface of the lower ILD layers. FIGS. 8A-8B illustrate various views of some embodiments corresponding to act 1808.

At act 1810, a first capacitor dielectric layer is formed over the lower first electrode layer. FIGS. 8A-8B illustrate various views of some embodiments corresponding to act 1810.

At act 1812, a lower second electrode layer is formed over the first capacitor dielectric layer. FIGS. 8A-8B illustrate various views of some embodiments corresponding to act 1812.

At act 1814, a second capacitor dielectric layer is formed over the lower second electrode layer. FIGS. 9A-9B illustrate various views of some embodiments corresponding to act 1814.

At act 1816, the first and second capacitor dielectric layers are patterned according to a first masking layer, thereby exposing a segment of the lower first electrode layer. FIGS. 10A-10B illustrate various views of some embodiments corresponding to act 1816.

At act 1818, an upper first electrode layer is formed over the second capacitor dielectric layer. The upper first electrode layer directly contacts the segment of the lower first electrode layer in a first connection region, thereby defining a first electrode. FIGS. 11A-11B and 12A-12B illustrate various views of some embodiments corresponding to act 1818.

At act 1820, a third capacitor dielectric layer is formed over the upper first electrode layer. FIGS. 13A-13B illustrate various views of some embodiments corresponding to act 1820.

At act 1822, the second and third capacitor dielectric layers are patterned according to a second masking layer, thereby exposing a segment of the lower second electrode layer. FIGS. 14A-14B illustrate various views of some embodiments corresponding to act 1822.

At act 1824, an upper second electrode layer is formed over the third capacitor dielectric layer and the lower second electrode layer. The upper second electrode layer directly contacts the segment of the lower second electrode layer in a second connection region, thereby defining a second electrode. FIGS. 15A-15B and 16A-16B illustrate various views of some embodiments corresponding to act 1824.

At act 1826, an upper interconnect structure is formed over the second electrode. The upper interconnect structure includes an upper conductive via overlying and directly contacting the second electrode. FIGS. 17A-17B illustrate various views of some embodiments corresponding to act 1826.

Accordingly, in some embodiments, the present disclosure relates to trench capacitor including a first electrode and a second electrode. The first and second electrodes each include a plurality of electrode layers stacked over another and electrically connected together.

In some embodiments, the present application provides an integrated circuit (IC) including a substrate; a capacitor disposed over the substrate and including: a first electrode including a plurality of first electrode layers that are vertically stacked over one another, wherein the plurality of first electrode layers respectively contact an adjacent first electrode layer in a plurality of first connection regions; a second electrode including a plurality of second electrode layers that are vertically stacked over one another, wherein the plurality of second electrode layers respectively contact an adjacent second electrode layer in a plurality of second connection regions, wherein the second plurality of electrode layers are respectively stacked between adjacent ones of the plurality of first electrode layers; and a capacitor dielectric structure that separates the plurality of first electrode layers and the plurality of second electrode layers.

In some embodiments, the present application provides an integrated circuit (IC) including a first substrate; a photodetector disposed within the first substrate; an inter-level dielectric (ILD) layer overlying the first substrate, wherein the ILD layer comprises first opposing sidewalls that at least partially define a first trench that overlies the photodetector; a trench capacitor disposed within the first trench, wherein the trench capacitor includes a first electrode disposed within the first trench and including a lower first electrode layer and an upper first electrode layer that directly contact one another in a first region laterally offset from the first trench; a second electrode disposed within the first trench and including a lower second electrode layer and an upper second electrode layer that directly contact one another in a second region laterally offset from the first trench; a capacitor dielectric structure disposed within the first trench and separating the first and second electrodes from one another; and wherein the lower second electrode layer is disposed between the lower and upper first electrode layers, and wherein the upper first electrode layer is disposed between the lower and upper second electrode layers.

In some embodiments, the present application provides a method for forming a trench capacitor, the method including forming a lower interconnect structure over a substrate, wherein the lower interconnect structure comprises a lower conductive wire disposed within a lower inter-level dielectric (ILD) structure; patterning the lower interconnect structure to form a trench that exposes an upper surface of the lower conductive wire; forming a lower first electrode layer overlying the lower ILD structure and lining the trench over the lower conductive wire; forming a first capacitor dielectric layer overlying the lower first electrode layer and lining the trench; forming a lower second electrode layer overlying the first capacitor dielectric layer and lining the trench; forming a second capacitor dielectric layer overlying the lower second electrode layer and lining the trench; patterning the first and second capacitor dielectric layers to expose a segment of the lower first electrode layer in a first region laterally offset from the trench; and forming an upper first electrode layer over the second capacitor dielectric layer and lining the trench and directly contacting the lower first electrode layer in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a substrate;
a capacitor disposed over the substrate and comprising:
  a first electrode comprising a plurality of first electrode layers that are vertically stacked over one another, wherein the plurality of first electrode layers respectively contact an adjacent first electrode layer in a first connection region;
  a second electrode comprising a plurality of second electrode layers that are vertically stacked over one another, wherein the plurality of second electrode layers respectively contact an adjacent second electrode layer in a second connection region, wherein the plurality of second electrode layers are respectively stacked between adjacent ones of the plurality of first electrode layers;
  a capacitor dielectric structure that separates the plurality of first electrode layers and the plurality of second electrode layers; and
  wherein an outer sidewall of the second electrode directly overlies the first connection region.

2. The IC of claim 1, further comprising:
an interconnect structure overlying the substrate and comprising opposing sidewalls that at least partially define a trench, wherein the first electrode, the second electrode and the capacitor dielectric structure are disposed within the trench.

3. The IC of claim 2, wherein the first and second connection regions are respectively laterally offset from the trench.

4. The IC of claim 2, wherein the interconnect structure comprises:
an interconnect dielectric structure having the opposing sidewalls that at least partially define the trench;
a plurality of conductive vias disposed within the interconnect dielectric structure and comprising an upper conductive via;
a plurality of conductive wires disposed within the interconnect dielectric structure and comprising a lower conductive wire;
wherein a bottommost first electrode layer directly contacts the lower conductive wire and a topmost second electrode layer directly contacts the upper conductive via; and
a dielectric protection layer continuously extending along a top surface of the lower conductive wire to opposing sidewalls of the bottommost first electrode layer.

5. The IC of claim 4, wherein the conductive wires are arranged in a plurality of layers vertically offset from one another by a layer of conductive vias, wherein a trench segment of the capacitor completely fills the trench and vertically extends from above a top surface of a first layer of conductive wires to below a bottom surface of the first layer of conductive wires, wherein the first layer of conductive wires is vertically above the lower conductive wire.

6. The IC of claim 2, wherein the plurality of first electrode layers includes a lower first electrode layer and an upper first electrode layer, wherein the plurality of second electrode layers includes a lower second electrode layer and an upper second electrode layer, wherein the lower second electrode layer is disposed between the upper and lower first electrode layers and the upper first electrode layer is disposed between the upper and lower second electrode layers, and wherein the lower first electrode layer continuously extends from an upper surface of the interconnect structure along the opposing sidewalls of the interconnect structure to the first connection region.

7. The IC of claim 1, further comprising:
a single conductive via overlying the capacitor and directly contacting the second electrode, wherein the single conductive via is an only via in direct contact with the capacitor.

8. The IC of claim 1, wherein the second connection region directly overlies a portion of the first electrode.

9. An integrated circuit (IC) comprising:
a first substrate;
a photodetector disposed within the first substrate;
an inter-level dielectric (ILD) layer overlying the first substrate, wherein the ILD layer comprises first opposing sidewalls that at least partially define a first trench that overlies the photodetector;
a trench capacitor disposed within the first trench, wherein the trench capacitor comprises:
  a first electrode disposed within the first trench and comprising a lower first electrode layer and an upper first electrode layer that directly contact one another in a first region laterally offset from the first trench;
  a second electrode disposed within the first trench and comprising a lower second electrode layer and an upper second electrode layer that directly contact one another in a second region laterally offset from the first trench;

a capacitor dielectric structure disposed within the first trench and separating the first and second electrodes from one another;

wherein the lower second electrode layer is disposed between the lower and upper first electrode layers, and wherein the upper first electrode layer is disposed between the lower and upper second electrode layers; and a second substrate overlying the first substrate, wherein the ILD layer is sandwiched between the first substrate and the second substrate, wherein the trench capacitor continuously extends through the second substrate, wherein the second substrate comprises sidewalls defining at least a portion of the first trench, and wherein the lower first electrode layer continuously extends from an upper surface of the second substrate to the sidewalls of the ILD layer.

10. The IC of claim 9, further comprising:

a conductive wire disposed within the ILD layer, wherein a bottom surface of the lower first electrode layer directly contacts an upper surface of the conductive wire; and a conductive via disposed over the trench capacitor, wherein a bottom surface of the conductive via directly contacts an upper surface of the upper second electrode layer.

11. The IC of claim 10, wherein the conductive via is a single via and is an only conductive via that directly contacts the second electrode such that another conductive via does not directly contact the trench capacitor.

12. The IC of claim 11, wherein the conductive wire is an only conductive wire that directly contacts the trench capacitor.

13. The IC of claim 9, wherein the first trench is spaced laterally between the first region and the second region.

14. The IC of claim 9, wherein an outer perimeter of the trench capacitor is spaced laterally between outer sidewalls of the photodetector.

15. The IC of claim 9, wherein the ILD layer comprises second opposing sidewalls that at least partially define a second trench laterally offset from the first trench, wherein the first electrode, the second electrode, and the capacitor dielectric structure respectively line the second trench, wherein the first and second trenches are spaced laterally between the first and second regions.

16. The IC of claim 9, wherein the lower first electrode layer, the upper first electrode layer, and the lower second electrode layer respectively have a U-shaped profile within the trench, and the upper second electrode layer has a T-shaped profile.

17. A method for forming a trench capacitor, the method comprising:

forming a lower interconnect structure over a substrate, wherein the lower interconnect structure comprises a lower conductive wire disposed within a lower inter-level dielectric (ILD) structure;

patterning the lower interconnect structure to form a trench that exposes an upper surface of the lower conductive wire;

forming a lower first electrode layer overlying the lower ILD structure and lining the trench over the lower conductive wire;

forming a first capacitor dielectric layer overlying the lower first electrode layer and lining the trench;

forming a lower second electrode layer overlying the first capacitor dielectric layer and lining the trench;

forming a second capacitor dielectric layer overlying the lower second electrode layer and lining the trench;

patterning the first and second capacitor dielectric layers to expose a segment of the lower first electrode layer in a first region laterally offset from the trench;

forming an upper first electrode layer over the second capacitor dielectric layer and lining the trench and directly contacting the lower first electrode layer in the first region;

forming a third capacitor dielectric layer overlying the upper first electrode layer and lining the trench; and forming an upper second electrode layer over the third capacitor dielectric layer and the trench such that the upper second electrode layer directly contacts the lower second electrode layer in a second region laterally offset from the first region, wherein an outer sidewall of the upper second electrode layer directly overlies the first region.

18. The method of claim 17, wherein the lower first electrode layer, the upper first electrode layer, and the lower second electrode layer respectively have a U-shaped profile within the trench, and wherein the lower second electrode layer is disposed between the lower and upper first electrode layers across an entire distance of the trench.

19. The method of claim 17, wherein forming the upper first electrode layer comprises:

depositing the upper first electrode layer over the second capacitor dielectric layer and the trench;

forming a masking layer over the upper first electrode layer, wherein the masking layer overlies the segment of the lower first electrode layer in the first region; and performing an etch into the upper first electrode layer with the masking layer in place.

20. The method of claim 17, wherein before forming the upper second electrode layer, further comprising:

patterning the second and third capacitor dielectric layers to expose a segment of the lower second electrode layer in the second region laterally offset from the trench.

* * * * *